United States Patent
Ikebe et al.

(10) Patent No.: US 12,411,402 B2
(45) Date of Patent: Sep. 9, 2025

(54) REFLECTIVE MASK BLANK, REFLECTIVE MASK, AND METHOD FOR MANUFACTURING SEMICONDUCTOR DEVICE

(71) Applicant: HOYA CORPORATION, Tokyo (JP)

(72) Inventors: Yohei Ikebe, Tokyo (JP); Osamu Nozawa, Tokyo (JP)

(73) Assignee: HOYA CORPORATION, Tokyo (JP)

( * ) Notice: Subject to any disclaimer, the term of this patent is extended or adjusted under 35 U.S.C. 154(b) by 553 days.

(21) Appl. No.: 17/772,641

(22) PCT Filed: Oct. 19, 2020

(86) PCT No.: PCT/JP2020/039208
§ 371 (c)(1),
(2) Date: Apr. 28, 2022

(87) PCT Pub. No.: WO2021/100383
PCT Pub. Date: May 27, 2021

(65) Prior Publication Data
US 2022/0390826 A1    Dec. 8, 2022

(30) Foreign Application Priority Data
Nov. 21, 2019   (JP) ................... 2019-210488

(51) Int. Cl.
*G03F 1/24* (2012.01)
*G03F 1/26* (2012.01)
*G03F 1/48* (2012.01)

(52) U.S. Cl.
CPC ................. *G03F 1/24* (2013.01); *G03F 1/26* (2013.01); *G03F 1/48* (2013.01)

(58) Field of Classification Search
CPC ................................. G03F 1/22; G03F 1/24
See application file for complete search history.

(56) References Cited

U.S. PATENT DOCUMENTS

| 9,618,837 | B2 | 4/2017 | Lu et al. |
| 2006/0099517 | A1 | 5/2006 | Sugawara |

(Continued)

FOREIGN PATENT DOCUMENTS

| CN | 102089860 A | 6/2011 |
| JP | 2004096063 A | 3/2004 |

(Continued)

OTHER PUBLICATIONS

Machine translation of JP 2010-080659 (Apr. 2010).*

(Continued)

*Primary Examiner* — Martin J Angebranndt
(74) *Attorney, Agent, or Firm* — Sughrue Mion, PLLC

(57) ABSTRACT

Provided is a reflective mask blank comprising a phase shift film having a small change in the phase difference and/or reflectance of the phase shift film even in a case where the film thickness of the phase shift film changes.

A reflective mask blank comprises a multilayer reflective film and a phase shift film in this order on a main surface of a substrate. The phase shift film comprises a lower layer and an uppermost layer. The lower layer is located between the uppermost layer and the multilayer reflective film. The lower layer is formed of a material in which the total content of ruthenium and chromium is 90 atomic % or more, or a material in which the total content of ruthenium, chromium, and nitrogen is 90 atomic % or more. The uppermost layer is formed of a material in which the total content of ruthenium, chromium, and oxygen is 90 atomic % or more.

20 Claims, 3 Drawing Sheets

(56) References Cited

U.S. PATENT DOCUMENTS

| | | |
|---|---|---|
| 2011/0020737 A1 | 1/2011 | Kamo et al. |
| 2011/0104595 A1 | 5/2011 | Hayashi et al. |
| 2015/0261082 A1* | 9/2015 | Shih .................. G03F 7/20 430/5 |
| 2017/0017151 A1* | 1/2017 | Matsushima ............ G03F 1/24 |
| 2017/0038673 A1* | 2/2017 | Ikebe ....................... G03F 1/48 |
| 2018/0329285 A1 | 11/2018 | Hamamoto et al. |
| 2019/0079383 A1 | 3/2019 | Ikebe |
| 2022/0107557 A1* | 4/2022 | Ikebe ....................... G03F 1/58 |
| 2022/0236635 A1* | 7/2022 | Shin ......................... G03F 1/32 |
| 2023/0076438 A1* | 3/2023 | Fukasawa ............... G03F 1/32 |
| 2023/0132780 A1* | 5/2023 | Sasaki ..................... G03F 1/54 430/5 |
| 2023/0168575 A1* | 6/2023 | Ikebe ....................... G03F 1/32 |
| 2023/0333459 A1* | 10/2023 | Ikebe ....................... G03F 1/24 |
| 2023/0418148 A1* | 12/2023 | Fukasawa ............... G03F 7/20 |
| 2024/0069428 A1* | 2/2024 | Ikebe .................. C03C 17/3665 |
| 2024/0319577 A1* | 9/2024 | Maeda ..................... G03F 1/24 |

FOREIGN PATENT DOCUMENTS

| | | | | |
|---|---|---|---|---|
| JP | 2004281967 A | * | 10/2004 | |
| JP | 2010080659 A | | 4/2010 | |
| JP | 2011029334 A | | 2/2011 | |
| JP | 5282507 B2 | | 6/2013 | |
| JP | 5943306 B2 | | 6/2016 | |
| JP | 2016122684 A | | 7/2016 | |
| JP | 2017181571 A | | 10/2017 | |
| JP | 2018088006 A | | 6/2018 | |
| JP | 2018146945 A | * | 9/2018 | ............ C23C 14/14 |
| TW | 201525607 A | | 7/2015 | |
| WO | WO-2019225736 A1 | * | 11/2019 | ............... G03F 1/24 |

OTHER PUBLICATIONS

PCT/JP2020/039208, "English Translation of International Search Report", Dec. 22, 2020, 2 pages.

TW109140277, "Office Action", Sep. 5, 2024, 6 pages.

Office Action issued Jun. 20, 2025 in the counterpart Korean Patent Application No. 10-2022-7013578.

* cited by examiner (A)

(B)

(C)

(D)

(E)

(F)

REFLECTIVE MASK BLANK, REFLECTIVE MASK, AND METHOD FOR MANUFACTURING SEMICONDUCTOR DEVICE

CROSS-REFERENCE TO RELATED APPLICATIONS

This application is the National Stage of International Application No. PCT/JP2020/039208, filed Oct. 19, 2020, which claims priority to Japanese Patent Application No. 2019-210488, filed on Nov. 21, 2019, and the contents of which is incorporated by reference.

TECHNICAL FIELD

The present disclosure relates to a reflective mask blank which is an original plate for manufacturing an exposure mask used, for example, for manufacturing a semiconductor device, a reflective mask, and a method for manufacturing a semiconductor device.

BACKGROUND ART

An exposure device in semiconductor device manufacturing has developed while gradually shortening the wavelength of a light source. In order to achieve finer pattern transfer, extreme ultra violet (EUV) lithography using EUV (hereinafter also referred to as EUV light) having a wavelength around 13.5 nm has been developed. In the EUV lithography, a reflective mask is used because there are few materials transparent to EUV light. Typical examples of the reflective mask include a binary type reflective mask and a phase shift type reflective mask (a halftone phase shift type reflective mask). The binary type reflective mask has a relatively thick absorber pattern that sufficiently absorbs EUV light. The phase shift type reflective mask has a relatively thin absorber pattern (phase shift pattern) that reduces EUV light by light absorption and generates reflected light having a phase substantially inverted (phase inverted by approximately 180 degrees) with respect to reflected light from a multilayer reflective film. With the phase shift type reflective mask, high transfer optical image contrast can be obtained due to a phase shift effect, and therefore resolution can be further improved. In addition, since an absorber pattern (phase shift pattern) of the phase shift type reflective mask has a thin film thickness, a highly accurate and fine phase shift pattern can be formed.

Patent Documents 1 and 2 describe techniques related to such a reflective mask for EUV lithography and a mask blank for manufacturing the reflective mask.

Patent Document 1 describes a reflective exposure mask including a multilayer reflective film that serves as a high reflection area with respect to exposure light and an absorber pattern that absorbs the exposure light and serves as a low reflection area with respect to the exposure light. In addition, Patent Document 1 describes that a phase difference between reflected light of the exposure light from the multilayer reflective film and reflected light of the exposure light from the absorber pattern is within 180 degrees±10 degrees. Furthermore, Patent Document 1 describes use of an absorber pattern having a single layer structure formed of a Ru film containing Ru as a main component or an absorber pattern having a multilayer structure formed of a layered film of a Ru film and a Cr film thinner than the Ru film and containing Cr as a main component as the absorber pattern. In addition, Patent Document 1 describes use of, for example, a CrRu alloy and a CrRuN alloy as a material of the Ru film containing Ru as a main component.

Patent Document 2 describes a halftone type EUV mask including a substrate, a high reflection portion formed on the substrate, and a low reflection portion formed on the high reflection portion and patterned. In addition, Patent Document 2 describes that the low reflection portion has a structure in which a first layer containing Ta (tantalum) and a second layer containing Ru (ruthenium) are layered.

PRIOR ART DOCUMENTS

Patent Documents

Patent Document 1: JP 2011-29334 A
Patent Document 2: JP 5282507 B2

DISCLOSURE OF INVENTION

Technical Problem

The finer the pattern is and the higher the accuracy of a pattern dimension and a pattern position is, the more the electrical characteristics and performance of the semiconductor device increase, the more the degree of integration can be improved, and the more a chip size can be reduced. Therefore, the EUV lithography is required to have pattern transfer performance with higher accuracy and a finer dimension than before. At present, it is required to form an ultrafine and highly accurate pattern for a half pitch 16 nm (hp 16 nm) generation. In response to such a demand, a reflective phase shift mask using EUV light as exposure light and further using a phase shift effect is required.

In the EUV lithography, a projection optical system including a large number of reflecting mirrors is used due to light transmittance. EUV light is obliquely incident on the reflective mask to prevent these reflecting mirrors from blocking projection light (exposure light). At present, an incident angle of 6 degrees with respect to a vertical plane of a reflective mask substrate is the mainstream.

In the EUV lithography, since exposure light is obliquely incident, there is an inherent problem called a shadowing effect. The shadowing effect is a phenomenon in which exposure light is obliquely incident on an absorber pattern having a three-dimensional structure to form a shadow and the dimension and position of a transferred and formed pattern change. The three-dimensional structure of the absorber pattern serves as a wall to form a shadow on a shade side, and the dimension and position of the transferred and formed pattern change. For example, there are differences in the dimension and position of a transfer pattern between a case where the orientation of the absorber pattern to be formed is parallel to a direction of obliquely incident light and a case where the orientation of the absorber pattern to be formed is perpendicular to the direction of the obliquely incident light, which decreases transfer accuracy.

A reflective phase shift mask using EUV light as exposure light has a problem that a phase difference and a reflectance are largely changed with respect to a change in the film thickness of the phase shift film due to the short wavelength of the exposure light. For example, in a case of a reflective mask blank in which a phase shift film has a single-layer structure, oxidation of a surface layer of the phase shift film may progress in a process of patterning the phase shift film of the mask blank to manufacture a reflective phase shift mask. Oxidation of the surface layer of the phase shift film may cause a phenomenon of a change in optical characteristics and/or a decrease in film thickness. Even if such a phenomenon that occurs in the phase shift film is slight, the phase difference and/or the reflectance of the phase shift film may change.

In the reflective phase shift mask, it is required to reduce the above shadowing effect due to a demand for ultrafine and highly accurate pattern formation. Therefore, in the reflective phase shift mask, it is required to further reduce the film thickness of the absorber film (phase shift film). However, the phase shift film needs to have a function of reflecting exposure light with a predetermined reflectance in addition to a function of generating a predetermined phase difference with respect to the exposure light. Therefore, in a case where a phase shift film having a single-layer structure is formed, there is a limit to reducing the thickness of the film. By forming a phase shift film having a multilayer structure and optimizing the design of each layer to use an interference effect, the phase shift film having a predetermined phase difference and a predetermined reflectance can be formed with a thinner thickness. However, in the case of the phase shift film having a multilayer structure, in particular, the thickness and/or optical characteristics of an uppermost layer of the phase shift film are likely to change. In the phase shift film having a multilayer structure, a stronger interference effect is used. Therefore, in the phase shift film having a multilayer structure, there is a problem that the phase difference and/or the reflectance is likely to change due to a change in the film thickness (that is, the film thickness of the phase shift film including the uppermost layer) and/or optical characteristics of the uppermost layer.

Meanwhile, in a case where a phase shift film of a reflective mask blank is patterned to manufacture a reflective mask, mask inspection using a mask inspection apparatus is generally performed in order to confirm that a designed pattern is accurately formed on the phase shift film having a pattern formed thereon. Many mask inspection apparatuses use deep ultraviolet light (DUV light) having a wavelength of 193 nm or the like as inspection light.

When a phase shift film having a pattern formed thereon is inspected with a mask inspection apparatus using DUV light as inspection light, it may be difficult to perform high-accuracy inspection. A reason for this is considered as follows. That is, a portion where the phase shift film is removed and a multilayer reflective film is exposed has a high reflectance with respect to DUV light. In order to inspect the pattern with high accuracy, it is required that the reflectance of a portion of the phase shift pattern where the phase shift film is left with respect to DUV light is sufficiently low. However, in particular, a phase shift film having a multilayer structure has not only a strong interference effect with respect to EUV light but also a strong interference effect with respect to DUV light. In such a phase shift film, it is difficult to perform high-accuracy inspection in mask inspection using DUV light, which is a problem.

Therefore, an aspect of the present disclosure is to provide a reflective mask blank including a phase shift film having a multilayer structure, the reflective mask blank including a phase shift film having a small change in the phase difference and/or the reflectance of the phase shift film even in a case where the film thickness of the phase shift film changes. Another aspect of the present disclosure is to provide a reflective mask blank including a phase shift film that can be inspected with high accuracy in mask inspection using DUV light.

Still another aspect of the present disclosure is to provide a reflective mask manufactured using the reflective mask blank, and a method for manufacturing a semiconductor device using the reflective mask.

Solution to Problem

In order to solve the above problems, the present disclosure has the following configurations.

(Configuration 1)

Configuration 1 of the present disclosure is a reflective mask blank comprising a multilayer reflective film and a phase shift film in this order on a main surface of a substrate, in which
the phase shift film comprises a lower layer and an uppermost layer, the lower layer is located between the uppermost layer and the multilayer reflective film,
the lower layer is formed of a material in which the total content of ruthenium and chromium is 90 atomic % or more, or a material in which the total content of ruthenium, chromium, and nitrogen is 90 atomic % or more, and
the uppermost layer is formed of a material in which the total content of ruthenium, chromium, and oxygen is 90 atomic % or more.

(Configuration 2)

Configuration 2 of the present disclosure is the reflective mask blank according to configuration 1, in which an element having the largest content in the uppermost layer is oxygen.

(Configuration 3)

Configuration 3 of the present disclosure is the reflective mask blank according to configuration 1 or 2, in which an element having the largest content in the lower layer is ruthenium.

(Configuration 4)

Configuration 4 of the present disclosure is the reflective mask blank according to any one of configurations 1 to 3, in which a ratio obtained by dividing the content (atomic %) of chromium by the total content (atomic %) of ruthenium and chromium in the uppermost layer is larger than a ratio obtained by dividing the content (atomic %) of chromium by the total content (atomic %) of ruthenium and chromium in the lower layer.

(Configuration 5)

Configuration 5 of the present disclosure is the reflective mask blank according to any one of configurations 1 to 4, in which a refractive index n of the uppermost layer with respect to light having a wavelength of 13.5 nm is larger than a refractive index n of the lower layer with respect to light having a wavelength of 13.5 nm.

(Configuration 6)

Configuration 6 of the present disclosure is the reflective mask blank according to configuration 5, in which the refractive index n of the uppermost layer with respect to light having a wavelength of 13.5 nm is 0.94 or less.

(Configuration 7)

Configuration 7 of the present disclosure is the reflective mask blank according to any one of configurations 1 to 6, in which a refractive index n of the uppermost layer with respect to light having a wavelength of 193 nm is larger than a refractive index n of the lower layer with respect to light having a wavelength of 193 nm.

(Configuration 8)

Configuration 8 of the present disclosure is the reflective mask blank according to configuration 7, in which the refractive index n of the uppermost layer with respect to light having a wavelength of 193 nm is 5.0 or less.

(Configuration 9)

Configuration 9 of the present disclosure is the reflective mask blank according to configuration 7 or 8, in which an extinction coefficient k of the uppermost layer with respect to light having a wavelength of 193 nm is 3.2 or less.

(Configuration 10)

Configuration 10 of the present disclosure is the reflective mask blank according to any one of the configurations 1 to 9, comprising a protective film between the multilayer reflective film and the phase shift film.

(Configuration 11)

Configuration 11 of the present disclosure is a reflective mask comprising a multilayer reflective film and a phase shift film having a transfer pattern formed thereon in this order on a main surface of a substrate, in which the phase shift film comprises a lower layer and an uppermost layer, the lower layer is located between the uppermost layer and the multilayer reflective film, the lower layer is formed of a material in which the total content of ruthenium and chromium is 90 atomic % or more, or a material in which the total content of ruthenium, chromium, and nitrogen is 90 atomic % or more, and the uppermost layer is formed of a material in which the total content of ruthenium, chromium, and oxygen is 90 atomic % or more.

(Configuration 12)

Configuration 12 of the present disclosure is the reflective mask according to configuration 11, in which an element having the largest content in the uppermost layer is oxygen.

(Configuration 13)

Configuration 13 of the present disclosure is the reflective mask according to configuration 11 or 12, in which an element having the largest content in the lower layer is ruthenium.

(Configuration 14)

Configuration 14 of the present disclosure is the reflective mask according to any one of configurations 11 to 13, in which a ratio obtained by dividing the content (atomic %) of chromium by the total content (atomic %) of ruthenium and chromium in the uppermost layer is larger than a ratio obtained by dividing the content (atomic %) of chromium by the total content (atomic %) of ruthenium and chromium in the lower layer.

(Configuration 15)

Configuration 15 of the present disclosure is the reflective mask according to any one of configurations 11 to 14, in which a refractive index n of the uppermost layer with respect to light having a wavelength of 13.5 nm is larger than a refractive index n of the lower layer with respect to light having a wavelength of 13.5 nm.

(Configuration 16)

Configuration 16 of the present disclosure is the reflective mask according to configuration 15, in which the refractive index n of the uppermost layer with respect to light having a wavelength of 13.5 nm is 0.94 or less.

(Configuration 17)

Configuration 17 of the present disclosure is the reflective mask according to any one of configurations 11 to 16, in which a refractive index n of the uppermost layer with respect to light having a wavelength of 193 nm is larger than a refractive index n of the lower layer with respect to light having a wavelength of 193 nm.

(Configuration 18)

Configuration 18 of the present disclosure is the reflective mask according to configuration 17, in which the refractive index n of the uppermost layer with respect to light having a wavelength of 193 nm is 5.0 or less.

(Configuration 19)

Configuration 19 of the present disclosure is the reflective mask according to configuration 17 or 18, in which an extinction coefficient k of the uppermost layer with respect to light having a wavelength of 193 nm is 3.2 or less.

(Configuration 20)

Configuration 20 of the present disclosure is the reflective mask according to any one of the configurations 11 to 19, comprising a protective film between the multilayer reflective film and the phase shift film.

(Configuration 21)

Configuration 21 of the present disclosure is a method for manufacturing a semiconductor device, the method comprising exposing and transferring a transfer pattern onto a resist film on a semiconductor substrate using the reflective mask according to any one of configurations 11 to 20.

Advantageous Effects of Disclosure

The present disclosure can provide a reflective mask blank including a phase shift film having a multilayer structure, the reflective mask blank including a phase shift film having a small change in the phase difference and/or the reflectance of the phase shift film with respect to EUV light having a wavelength of 13.5 nm even in a case where the film thickness of the phase shift film changes. The present disclosure can also provide a reflective mask blank including a phase shift film that can be inspected with high accuracy in mask inspection using DUV light.

The present disclosure can also provide a reflective mask manufactured using the reflective mask blank, and a method for manufacturing a semiconductor device using the reflective mask.

DESCRIPTION OF EMBODIMENTS

Figure 1:
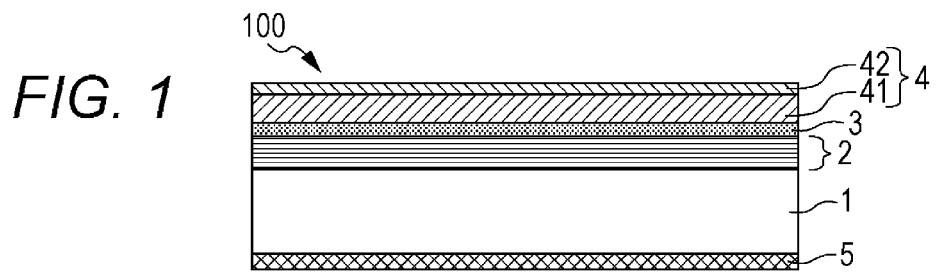
FIG. 1 is a main part schematic cross-sectional diagram for describing an example of a schematic configuration of a reflective mask blank according to an embodiment of the present disclosure.

Hereinafter, an embodiment of the present disclosure will be specifically described with reference to the drawings. Note that the following embodiment is one mode for embodying the present disclosure and does not limit the present disclosure within the scope thereof. Note that in the drawings, the same or corresponding portions are denoted by the same reference sign, and description thereof may be simplified or omitted.

<Configuration of Reflective Mask Blank 100 and Method for Manufacturing the Same>

FIG. 1 is a main part schematic cross-sectional diagram for describing a configuration of a reflective mask blank 100 of the present embodiment. As illustrated in FIG. 1, the reflective mask blank 100 includes a mask blank substrate 1 (also simply referred to as "substrate 1"), a multilayer reflective film 2, a protective film 3, and a phase shift film 4, and has a structure in which these are layered in this order. The multilayer reflective film 2 is formed on a side of a first main surface (front surface) of the substrate 1 and reflects EUV light that is exposure light with a high reflectance. The protective film 3 is formed in order to protect the multilayer reflective film 2 and is formed of a material having resistance to an etchant and a cleaning liquid used when the phase shift film 4 described later is patterned. The phase shift film 4 absorbs EUV light. In addition, a conductive film 5 for an electrostatic chuck is formed on a side of a second main surface (back surface) of the substrate 1.

Figure 2:
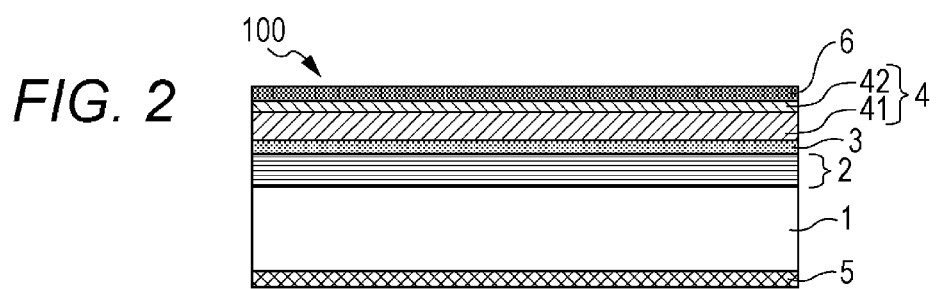
FIG. 2 is a main part schematic cross-sectional diagram for describing another example of the schematic configuration of the reflective mask blank according to the embodiment of the present disclosure.

FIG. 2 is a main part schematic cross-sectional diagram for describing another configuration of the reflective mask blank 100 of the present embodiment. Similarly to the case in FIG. 1, the reflective mask blank 100 illustrated in FIG. 2 includes the substrate 1, the multilayer reflective film 2, the protective film 3, the phase shift film 4, and the conductive film 5, and further includes an etching mask film 6.

In the present specification, the expression "having the multilayer reflective film 2 on a main surface of the mask blank substrate 1" means that the multilayer reflective film 2 is formed in contact with the surface of the mask blank substrate 1, and the expression also includes a meaning that there is another film between the mask blank substrate 1 and the multilayer reflective film 2. The same applies to other films. For example, the expression "having a film B on a film A" means that the film A and the film B are formed so as to be in direct contact with each other, and the expression also includes a meaning that there is another film between the film A and the film B. In addition, in the present specification, for example, the expression "the film A is formed in contact with a surface of the film B" means that the film A and the film B are formed in direct contact with each other without another film interposed between the film A and the film B.

In the present specification, an expression that a predetermined film (or layer) is, for example, "a film (or layer) formed of a material containing ruthenium and chromium" means that the predetermined film (or layer) is a film (or layer) formed of a material at least substantially containing ruthenium and chromium. Meanwhile, an expression that a predetermined film (or layer) is "a film (or layer) formed of ruthenium and chromium" may mean that the predetermined film (or layer) is formed of only ruthenium and chromium. Both expressions include that a predetermined film (or layer) contains an impurity that is inevitably mixed.

The present embodiment is the reflective mask blank 100 including the multilayer reflective film 2 and the phase shift film 4 in this order on a main surface of the substrate 1. The phase shift film 4 of the present embodiment includes a lower layer 41 and an uppermost layer 42. The lower layer 41 is located between the uppermost layer 42 and the multilayer reflective film 2. Hereinafter, the present embodiment will be described for each layer.

<<Substrate 1>>

As the substrate 1, a substrate having a low thermal expansion coefficient within a range of 0±5 ppb/° C. is preferably used in order to prevent distortion of a phase shift pattern 4a due to heat during exposure to EUV light. As a material having a low thermal expansion coefficient within this range, for example, $SiO_2$—$TiO_2$-based glass, multicomponent-based glass ceramics, or the like can be used.

The first main surface on a side of the substrate 1 on which a transfer pattern (to which the phase shift pattern 4a described later corresponds) is formed has been subjected to surface processing so as to have high flatness from a viewpoint of obtaining at least pattern transfer accuracy and position accuracy. In a case of EUV exposure, flatness in an area of 132 mm×132 mm of the main surface (first main surface) on the side of the substrate 1 on which the transfer pattern is formed is preferably 0.1 µm or less, more preferably 0.05 µm or less, and particularly preferably 0.03 µm or less. In addition, the second main surface on a side opposite to the side on which the transfer pattern is formed is a surface to be electrostatically chucked at the time of setting on an exposure apparatus, and flatness in an area of 132 mm×132 mm of the second main surface is preferably 0.1 µm or less, more preferably 0.05 µm or less, and particularly preferably 0.03 µm or less. Note that flatness in an area of 142 mm×142 mm on a side of the second main surface in the reflective mask blank 100 is preferably 1 µm or less, more preferably 0.5 µm or less, and particularly preferably 0.3 µm or less.

In addition, high surface smoothness of the substrate 1 is also an extremely important item. Surface roughness of the first main surface of the substrate 1 on which the phase shift pattern 4a for transfer is formed is preferably 0.1 nm or less in terms of root mean square roughness (RMS). Note that the surface smoothness can be measured with an atomic force microscope.

Furthermore, the substrate 1 preferably has high rigidity in order to suppress deformation due to a film stress applied to a film (such as the multilayer reflective film 2) formed on the substrate 1. In particular, the substrate 1 preferably has a high Young's modulus of 65 GPa or more.

<<Multilayer Reflective Film 2>>

The multilayer reflective film 2 imparts a function of reflecting EUV light in a reflective mask 200, and is a multilayer film in which layers mainly containing elements having different refractive indices are periodically layered.

Generally, as the multilayer reflective film 2, a multilayer film is used in which a thin film (high refractive index layer) of a light element that is a high refractive index material or a compound of the light element and a thin film (low refractive index layer) of a heavy element that is a low refractive index material or a compound of the heavy element are alternately layered for about 40 to 60 periods. The multilayer film may be formed by counting, as one period, a stack of a high refractive index layer and a low refractive index layer in which the high refractive index layer and the low refractive index layer are layered in this order from the substrate 1 and building up the stack for a plurality of periods. In addition, the multilayer film may be formed by counting, as one period, a stack of a low refractive index layer and a high refractive index layer in which the low refractive index layer and the high refractive index layer are layered in this order from the substrate 1 and building up the stack for a plurality of periods. Note that a layer on an outermost surface of the multilayer reflective film 2, that is, a surface layer of the multilayer reflective film 2 on a side opposite to the substrate 1 is preferably a high refractive index layer. In a case where in the multilayer film described above, a stack of a high refractive index layer and a low refractive index layer in which the high refractive index layer and the low refractive index layer are layered in this order from the substrate 1 is counted as one period and the stack is built up for a plurality of periods, the uppermost layer is a low refractive index layer. In this case, when the low refractive index layer constitutes the outermost surface of the multilayer reflective film 2, the low refractive index layer is easily oxidized and the reflectance of the reflective mask 200 is reduced. Therefore, it is preferable to further form a high refractive index layer on the low refractive index layer which is the uppermost layer to form the multilayer reflective film 2. Meanwhile, in the multilayer film described above, when a stack of a low refractive index layer and a high refractive index layer in which the low refractive index layer and the high refractive index layer are layered in this order from the substrate 1 is counted as one period and the stack is built up for a plurality of periods, the uppermost layer is a high refractive index layer, which is good as it is.

In the present embodiment, a layer containing silicon (Si) is adopted as the high refractive index layer. As a material containing Si, a Si compound containing Si and boron (B), carbon (C), nitrogen (N), and oxygen (O) can be used in addition to a Si simple substance. By using the layer containing Si as the high refractive index layer, the reflective mask 200 for EUV lithography having an excellent reflectance with respect to EUV light can be obtained. In addition, in the present embodiment, a glass substrate is preferably used as the substrate 1. Si also has excellent adhesion to the glass substrate. In addition, as the low refractive index layer, a metal simple substance selected from molybdenum (Mo), ruthenium (Ru), rhodium (Rh), and platinum (Pt), or an alloy thereof is used. For example, as the multilayer reflective film 2 with respect to EUV light having a wavelength of 13 nm to 14 nm, a Mo/Si periodic layered film in which a Mo film and a Si film are alternately layered for about 40 to 60 periods is preferably used. Note that the high refractive index layer which is the uppermost layer of the multilayer reflective film 2 may be formed of silicon (Si).

A reflectance of the multilayer reflective film 2 alone is usually 65% or more, and an upper limit thereof is usually 73%. Note that the film thickness and the period of each constituent layer of the multilayer reflective film 2 only need to be appropriately selected according to an exposure wavelength and are selected so as to satisfy the Bragg reflection law. In the multilayer reflective film 2, there are a plurality of high refractive index layers and a plurality of low refractive index layers, but the film thickness does not need to be the same between the high refractive index layers and between the low refractive index layers. In addition, the film thickness of the Si layer on the outermost surface of the multilayer reflective film 2 can be adjusted within a range that does not lower the reflectance. The film thickness of the Si layer (high refractive index layer) on the outermost surface can be 3 nm to 10 nm.

A method for forming the multilayer reflective film 2 is publicly known in this technical field. For example, the multilayer reflective film 2 can be formed by forming each layer in the multilayer reflective film 2 by an ion beam sputtering method. In the case of the Mo/Si periodic multilayer film described above, first, a Si film having a thickness of about 4 nm is formed on the substrate 1 using a Si target by, for example, an ion beam sputtering method. Thereafter, a Mo film having a thickness of about 3 nm is formed using a Mo target. This stack of a Si film and a Mo film is counted as one period and the stack is build up for 40 to 60 periods to form the multilayer reflective film 2 (the layer of the outermost surface is a Si layer). Note that, for example, in a case where the stack is build up for 60 periods to form the multilayer reflective film 2, the number of steps is larger than that in the case of 40 periods, but the reflectance with respect to EUV light can be increased. In addition, when the multilayer reflective film 2 is formed, the multilayer reflective film 2 is preferably formed by supplying krypton (Kr) ion particles from an ion source and performing ion beam sputtering.

<<Protective Film 3>>

The reflective mask blank 100 of the present embodiment preferably includes the protective film 3 between the multilayer reflective film 2 and the phase shift film 4.

The protective film 3 can be formed on the multilayer reflective film 2 or in contact with a surface of the multilayer reflective film 2 in order to protect the multilayer reflective film 2 from dry etching and cleaning in a process of manufacturing the reflective mask 200 described later. In addition, the protective film 3 also protects the multilayer reflective film 2 when a black defect of the phase shift pattern 4a is repaired using an electron beam (EB). Here, FIGS. 1 and 2 illustrate a case where the protective film 3 has one layer, but the protective film 3 can have a stack of three or more layers. The protective film 3 is formed of a material having resistance to an etchant and a cleaning liquid used when the phase shift film 4 is patterned. Formation of the protective film 3 on the multilayer reflective film 2 can suppress damage to a surface of the multilayer reflective film 2 when the reflective mask 200 (EUV mask) is manufactured using the substrate 1 including the multilayer reflective film 2 and the protective film 3. Therefore, a reflectance characteristic of the multilayer reflective film 2 with respect to EUV light is improved.

Hereinafter, a case where the protective film 3 has one layer will be described as an example. Note that in a case where the protective film 3 includes a plurality of layers, properties of a material of the uppermost layer (a layer in contact with the phase shift film 4) of the protective film 3 are important in relation to the phase shift film 4. In addition, in the present embodiment, since the phase shift film 4 includes a plurality of layers, properties of a material of a lowermost layer (layer in contact with the protective film 3, for example, the lower layer 41 in a case where the phase shift film 4 includes two layers) of the phase shift film 4 are important in relation to (the uppermost layer of) the protective film 3.

In the reflective mask blank 100 of the present embodiment, as a material of the protective film 3, a material having resistance to an etching gas used for the dry etching for patterning the phase shift film 4 formed on the protective film 3 can be selected.

In a case where the layer of the phase shift film 4 in contact with a surface of the protective film 3 is a thin film formed of a material containing ruthenium (Ru) and chromium (Cr) (predetermined RuCr-based material) like the lower layer 41 of the present embodiment, a material selected from a silicon-based material such as silicon (Si), a material containing silicon (Si) and oxygen (O), a material containing silicon (Si) and nitrogen (N), or a material containing silicon (Si), oxygen (O), and nitrogen (N), and a chromium-based material such as chromium (Cr) or a material containing chromium (Cr) and at least one element selected from oxygen (O), nitrogen (N), and carbon (C) can be used as a material of the protective film 3.

In a case where the layer of the phase shift film 4 in contact with a surface of the protective film 3 is a thin film formed of a material containing ruthenium (Ru) and chromium (Cr) (predetermined RuCr-based material) as in the present embodiment, a chlorine-based gas containing oxygen can be used as a dry etching gas for patterning the phase shift film 4. In this case, as a material of the protective film 3, a silicon-based material such as silicon (Si), a material containing silicon (Si) and oxygen (O), or a material containing silicon (Si) and nitrogen (N) is preferably selected.

The silicon-based material has resistance to the dry etching gas, and the resistance increases as the content of oxygen increases. Therefore, the material of the protective film 3 is more preferably silicon oxide ($SiO_x$, $1 \leq x \leq 2$). A larger value of x is still more preferable. The material of the protective film 3 is particularly preferably $SiO_2$. Note that, in a case where the phase shift film 4 includes a thin film layer other than the predetermined RuCr-based material and the layer of the phase shift film 4 in contact with a surface of the protective film 3 is a thin film layer other than the predetermined RuCr-based material, the material of the protective film 3 can be selected according to etching characteristics of the material.

In EUV lithography, since there are few substances that are transparent to exposure light, it is not technically easy to apply an EUV pellicle that prevents foreign matters from adhering to a mask pattern surface. For this reason, pellicle-less operation without using a pellicle has been the mainstream. In addition, in the EUV lithography, exposure contamination such as carbon film deposition on a mask or oxide film growth due to EUV exposure occurs. Therefore, at a stage where the reflective mask 200 for EUV exposure is used for manufacturing a semiconductor device, it is necessary to frequently clean the mask to remove foreign matters and contamination on the mask. Therefore, the reflective mask 200 for EUV exposure is required to have extraordinary mask cleaning resistance as compared with a transmissive mask for optical lithography. Inclusion of the protective film 3 in the reflective mask 200 can increase cleaning resistance to a cleaning liquid.

The film thickness of the protective film 3 is not particularly limited as long as the function of protecting the multilayer reflective film 2 is fulfilled. The film thickness of the protective film 3 is preferably 1.0 nm or more and 8.0 nm or less, and more preferably 1.5 nm or more and 6.0 nm or less from a viewpoint of the reflectance with respect to EUV light.

As a method for forming the protective film 3, it is possible to adopt a film forming method similar to a publicly known one without any particular limitation. Specific examples thereof include a sputtering method and an ion beam sputtering method.

<<Phase Shift Film 4>>

In the reflective mask blank 100 of the present embodiment, the phase shift film 4 that shifts a phase of EUV light is formed on the multilayer reflective film 2 or on the protective film 3 formed on the multilayer reflective film 2. As illustrated in FIGS. 1 and 2, the phase shift film 4 of the reflective mask blank 100 of the present embodiment includes the lower layer 41 and the uppermost layer 42.

By inclusion of the predetermined lower layer 41 and the predetermined uppermost layer 42 in the reflective mask blank 100 of the present embodiment, even in a case where the film thickness of the uppermost layer 42 of the phase shift film 4 having a multilayer structure changes, a change in the phase difference and/or the reflectance of the phase shift film 4 can be reduced. In addition, the phase shift film 4 of the reflective mask blank 100 of the present embodiment can be inspected with high accuracy in mask inspection using DUV light.

In the reflective mask blank 100 of the present embodiment, in a portion where the phase shift film 4 (phase shift pattern 4a) is formed, a part of light is reflected at a level that does not adversely affect pattern transfer while EUV light is absorbed and reduced. Meanwhile, in an opening (a portion where the phase shift film 4 is not formed), EUV light is reflected from the multilayer reflective film 2 (through the protective film 3 from the multilayer reflective film 2 in a case where the protective film 3 is formed). The reflected light from the portion where the phase shift film 4 is formed forms a desired phase difference with respect to the reflected light from the opening. The phase shift film 4 is formed such that a phase difference between the reflected light from the phase shift film 4 and reflected light from the multilayer reflective film 2 is 130 degrees to 230 degrees. Beams of light having a reversed phase difference around 180 degrees interfere with each other at a pattern edge portion to improve an image contrast of a projected optical image. As the image contrast is improved, resolution is increased, and various exposure-related margins such as an exposure margin and a focus margin increase.

In order to obtain the phase shift effect, a relative reflectance of the phase shift pattern 4a with respect to EUV light is preferably 2% to 40%, more preferably 6% to 35%, still more preferably 15% to 35%, and particularly preferably 15% to 25%, although it depends on a pattern and exposure conditions. Here, the relative reflectance of the phase shift film 4 (phase shift pattern 4a) is a reflectance with respect to EUV light reflected from the phase shift pattern 4a when a reflectance with respect to EUV light reflected from the multilayer reflective film 2 (including the multilayer reflective film 2 with the protective film 3) in a portion where the phase shift pattern 4a is not present is assumed to be 100%. Note that in the present specification, the relative reflectance may be simply referred to as "reflectance".

In order to obtain the phase shift effect, an absolute reflectance of the phase shift film 4 (or phase shift pattern 4a) with respect to EUV light is preferably 4% to 27%, and more preferably 10% to 17%, although it depends on a pattern and exposure conditions.

The phase shift film 4 of the present embodiment includes the lower layer 41 and the uppermost layer 42. The uppermost layer 42 is a layer located on an outermost surface on a side opposite to the multilayer reflective film 2 in the phase shift film 4. The lower layer 41 is a layer located at an arbitrary position between the uppermost layer 42 and the multilayer reflective film 2 in the phase shift film 4. The phase shift film 4 preferably includes two layers of the lower layer 41 and the uppermost layer 42 from a viewpoint that a film forming step can be simplified.

The phase shift film 4 of the reflective mask blank 100 of the present embodiment includes the lower layer 41. The lower layer 41 is formed of a material in which the total content of ruthenium (Ru) and chromium (Cr) is 90 atomic % or more, preferably 95 atomic % or more, and more preferably 98 atomic % or more. Alternatively, the lower layer 41 is formed of a material in which the total content of ruthenium (Ru), chromium (Cr), and nitrogen (N) is 90 atomic % or more, preferably 95 atomic % or more, and more preferably 98 atomic % or more. In the present specification, the material of the lower layer 41 containing ruthenium (Ru) and chromium (Cr) may be referred to as a RuCr-based material. In addition, in the present specification, the material of the lower layer 41 containing ruthenium (Ru), chromium (Cr), and nitrogen (N) may be referred to as a RuCrN-based material. Note that a material of the uppermost layer 42 described later also contains ruthenium (Ru) and chromium (Cr). Therefore, the materials of the lower layer 41 and the uppermost layer 42 of the present embodiment may be collectively referred to as a RuCr-based material.

By using a predetermined material as the lower layer 41 of the phase shift film 4 of the reflective mask blank 100 of the present embodiment, the phase shift pattern 4a having a relative reflectance within a predetermined range can be obtained. By using a predetermined material as a material of the lower layer 41 of the phase shift film 4 of the reflective mask blank 100 of the present embodiment, an absolute reflectance of the phase shift film 4 with respect to EUV light can be set within a predetermined range. In addition, the phase shift film 4 of the reflective mask blank 100 of the present embodiment can have a thin film thickness for obtaining a predetermined phase difference (a phase difference between reflected light from the multilayer reflective film 2 (including the multilayer reflective film 2 with the protective film 3) in the opening and reflected light from the phase shift pattern 4a). Thus, a shadowing effect generated by the phase shift pattern 4a can be further reduced in the reflective mask 200. In addition, by using the reflective mask 200 manufactured from the reflective mask blank 100 of the present embodiment, it is possible to improve a throughput when a semiconductor device is manufactured.

In the phase shift film 4 of the reflective mask blank 100 of the present embodiment, an element having the largest content in the lower layer 41 is preferably ruthenium (Ru).

The refractive index n of Ru with respect to EUV light is n=0.886 (extinction coefficient k=0.017), and Ru is preferable as a material of the phase shift film 4 having a high reflectance. Therefore, since the element having the largest content in the lower layer 41 of the phase shift film 4 is Ru, the phase shift film 4 having a high reflectance with respect to EUV light can be obtained.

The crystal structure of the lower layer 41 of the phase shift film 4 of the reflective mask blank 100 of the present embodiment is preferably amorphous. Note that inclusion of nitrogen (N) in addition to ruthenium (Ru) and chromium (Cr) in a material of the lower layer 41 can make the crystal structure amorphous. Note that the crystal structure of the uppermost layer 42 is preferably amorphous similarly.

A Ru-based compound is likely to have a crystallized structure and has poor processing characteristics. That is, a crystal grain of a crystallized metal is likely to increase a sidewall roughness when the phase shift pattern 4a is formed. Therefore, this may have an adverse effect when the predetermined phase shift pattern 4a is formed. Meanwhile, in a case where the crystal structure of the phase shift film 4 is amorphous, it is possible to reduce the adverse effect when the phase shift pattern 4a is formed. By adding Cr to Ru, the crystal structure of the phase shift film 4 can be made amorphous, an etching rate can be increased, a pattern shape can be improved, and processing characteristics can be improved. In addition, further inclusion of nitrogen (N) in addition to ruthenium (Ru) and chromium (Cr) can make the crystal structure more amorphous.

The binary material (RuCr-based material) obtained by adding Cr to Ru has better processing characteristics than RuTa that is a conventional material. It is difficult to etch oxidized Ta with a chlorine-based gas and an oxygen gas.

The content of ruthenium (Ru) in the lower layer 41 of the phase shift film 4 of the reflective mask blank 100 of the present embodiment is preferably 46 atomic % or more and 94 atomic % or less, and more preferably 50 atomic % or more and 90 atomic % or less. The content of chromium (Cr) in the lower layer 41 is preferably 4 atomic % or more and 48 atomic % or less, and more preferably 6 atomic % or more and 40 atomic % or less.

In a case where the lower layer 41 contains nitrogen (N), the content of N is preferably 2 atomic % or more and 30 atomic % or less, and more preferably 4 atomic % or more and 20 atomic % or less. Since the contents of ruthenium (Ru) and chromium (Cr) are within the above composition ranges, the lower layer 41 of the phase shift film 4 having a predetermined reflectance and phase difference can be obtained. Since the content of nitrogen is within the above composition range, it is possible to reliably make the crystal structure of the lower layer 41 amorphous.

Next, a blending ratio between ruthenium (Ru) and chromium (Cr) contained in the material of the lower layer 41 of the phase shift film 4 of the present embodiment will be described.

Figure 4:
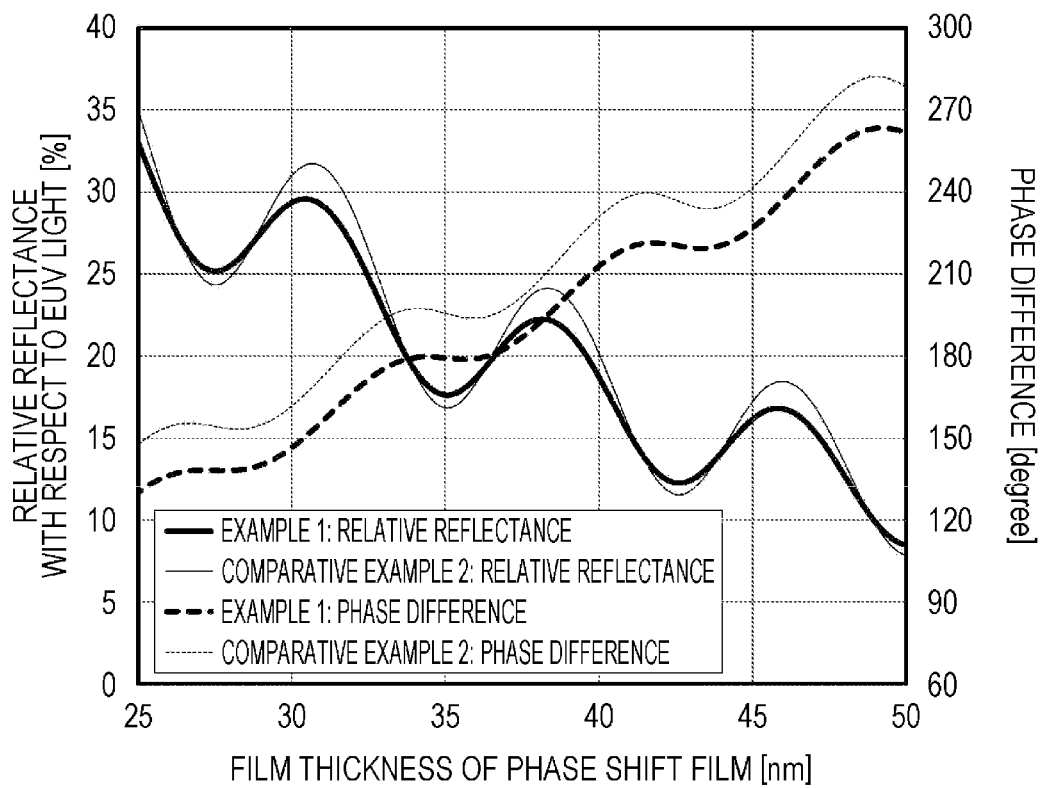
FIG. 4 is a diagram illustrating a relationship between the film thickness of a phase shift film using each of materials corresponding to Example 1 and Comparative Example 2, and a relative reflectance and a phase difference with respect to EUV light having a wavelength of 13.5 nm.

The relative reflectance and absolute reflectance of the RuCr-based material increase as the Ru content increases. In addition, reflected light of the phase shift film 4 is light generated by superposition of reflected light from a surface of the phase shift film 4 (uppermost layer 42), reflected light from an interface between the uppermost layer 42 and the lower layer 41, and reflected light from an interface between the phase shift film 4 (lower layer 41) and the protective film 3 or the multilayer reflective film 2). Therefore, the intensity of the reflected light of the phase shift film 4 has a periodic structure depending on the film thickness of the phase shift film 4. As a result, the reflectance and the phase difference of the phase shift film 4 also indicate a periodic structure depending on the film thickness, as illustrated as an example in FIG. 4. FIG. 4 illustrates a relationship between the film thickness of the phase shift film 4, and the relative reflectance and the phase difference with respect to EUV light in a case where the film thickness of the phase shift film 4 is changed by changing the film thickness of the lower layer 41 in the phase shift film 4 corresponding to Example 1. The refractive index n and the extinction coefficient k of the material of the phase shift film 4 affect the periodic structure. Meanwhile, the reflected light from the phase shift pattern 4a needs to have a predetermined phase difference with respect to the reflected light from the opening. In comprehensive consideration of the above, a relationship between the relative reflectance of the phase shift film 4, and the composition and the film thickness of the predetermined RuCr-based material was studied. As a result, regarding the composition and the film thickness of the predetermined RuCr-based material, preferable ranges can be illustrated according to the relative reflectance of the phase shift film 4.

The material (predetermined RuCr-based material) of the lower layer 41 of the phase shift film 4 can contain an element other than ruthenium (Ru) and chromium (Cr) (and nitrogen (N)) within a range not largely affecting the refractive index and the extinction coefficient. The material of the lower layer 41 can contain, for example, an element such as oxygen (O), carbon (C), or boron (B) in addition to Ru and Cr (and N). Oxygen (O), carbon (C), boron (B), and the like can also be added to the material of the lower layer 41 in a range that does not significantly affect the refractive index n and the extinction coefficient k for stabilization of the lower layer 41 and the like. In a case where the material of the lower layer 41 of the phase shift film 4 contains Ru, Cr (and N), and another element, the content of the above other element is preferably 10 atomic % or less, and more preferably 5 atomic % or less.

The phase shift film 4 of the reflective mask blank 100 of the present embodiment includes the uppermost layer 42. The uppermost layer 42 is formed of a material in which the total content of ruthenium (Ru), chromium (Cr), and oxygen (O) is 90 atomic % or more, preferably 95 atomic % or more, and more preferably 98 atomic % or more. The material of the uppermost layer 42 containing ruthenium (Ru), chromium (Cr), and oxygen (O) may be referred to as a RuCrO-based material.

The material of the uppermost layer 42 of the phase shift film 4 of the reflective mask blank 100 of the present embodiment will be further described.

In the phase shift film 4 of the reflective mask blank 100 of the present embodiment, an element having the largest content in the uppermost layer 42 is preferably oxygen (O).

Since the uppermost layer 42 of the phase shift film 4 is to be an outermost layer of the reflective mask 200, the uppermost layer 42 comes into contact with the atmosphere. Since the element having the largest content in the uppermost layer 42 of the phase shift film 4 of the reflective mask 200 is oxygen (O), a change in optical characteristics due to oxidation of the outermost layer can be suppressed. Therefore, it is possible to suppress a temporal change in the phase difference and the reflectance of the phase shift film 4 of the reflective mask 200.

The content of ruthenium (Ru) in the outermost layer of the phase shift film 4 of the reflective mask blank 100 of the present embodiment is preferably 2 atomic % or more and 48 atomic % or less, and more preferably 4 atomic % or more and 46 atomic % or less. The content of chromium (Cr) in the outermost layer is preferably 2 atomic % or more and 48 atomic % or less, and more preferably 4 atomic % or more and 46 atomic % or less. The content of oxygen (O) in the outermost layer is preferably 40 atomic % or more and 75 atomic % or less, and more preferably 45 atomic % or more and 70 atomic % or less. By setting the contents of Ru, Cr, and O within the above composition ranges, the outermost layer can have a function as an antireflection film with respect to both EUV light (for example, EUV light having a wavelength of 13.5 nm) and DUV light (for example, DUV light having a wavelength of 193 nm).

In the reflective mask blank 100 of the present embodiment, a ratio obtained by dividing the content (atomic %) of chromium (Cr) by the total content (atomic %) of ruthenium (Ru) and chromium (Cr) (hereinafter, referred to as Cr/[Ru+Cr] ratio) in the uppermost layer 42 is preferably larger than a ratio obtained by dividing the content (atomic %) of chromium (Cr) by the total content (atomic %) of ruthenium (Ru) and chromium (Cr) in the lower layer 41. The Cr/[Ru+Cr] ratio of the uppermost layer 42 is preferably 0.40 or more, and more preferably 0.42 or more. In addition, the Cr/[Ru+Cr] ratio of the uppermost layer 42 is preferably 0.9 or less, and more preferably 0.8 or less. Meanwhile, the Cr/[Ru+Cr] ratio of the lower layer 41 is preferably 0.05 or more, and more preferably 0.1. In addition, the Cr/[Ru+Cr] ratio of the lower layer 41 is preferably 0.49 or less, and more preferably 0.48 or less.

Since the content (atomic %) of chromium (Cr) in the uppermost layer 42 is relatively large as compared with that in the lower layer 41, crystallinity of the uppermost layer 42 can be made more microcrystalline, and resistance to a treatment such as dry etching when the etching mask film 6 is removed can also be increased.

In the reflective mask blank 100 of the present embodiment, a refractive index n of the uppermost layer 42 with respect to light having a wavelength of 13.5 nm is preferably larger than a refractive index n of the lower layer 41 with respect to light having a wavelength of 13.5 nm.

In the reflective mask blank 100 of the present embodiment, since the refractive index n of the uppermost layer 42 with respect to light having a wavelength of 13.5 nm is larger than the refractive index n of the lower layer 41 with respect to light having a wavelength of 13.5 nm, the uppermost layer 42 can have a function as an antireflection film with respect to EUV light having a wavelength of 13.5 nm.

In the reflective mask blank 100 of the present embodiment, the refractive index n of the uppermost layer 42 with respect to light having a wavelength of 13.5 nm is preferably 0.94 or less.

In the reflective mask blank 100 of the present embodiment, since the refractive index n of the uppermost layer 42 with respect to light having a wavelength of 13.5 nm is within a predetermined range, the uppermost layer 42 can have a more appropriate function as an antireflection film with respect to EUV light having a wavelength of 13.5 nm.

In the reflective mask blank 100 of the present embodiment, a refractive index n of the uppermost layer 42 with respect to light having a wavelength of 193 nm is preferably larger than a refractive index n of the lower layer 41 with respect to light having a wavelength of 193 nm.

In the reflective mask blank 100 of the present embodiment, since the refractive index n of the uppermost layer 42 with respect to light having a wavelength of 193 nm is larger than the refractive index n of the lower layer 41 with respect to light having a wavelength of 193 nm, the uppermost layer 42 can have a function as an antireflection film with respect to DUV light having a wavelength of 193 nm. As a result, the reflectance of the phase shift film 4 with respect to DUV light is sufficiently low. Therefore, the phase shift pattern 4a can be inspected with high accuracy using DUV light.

In the reflective mask blank 100 of the present embodiment, the refractive index n of the uppermost layer 42 with respect to light having a wavelength of 193 nm is preferably 5.0 or less. In addition, the refractive index n of the uppermost layer 42 with respect to light having a wavelength of 193 nm is preferably 1.7 or more, and more preferably 1.9 or more.

In the reflective mask blank 100 of the present embodiment, since the refractive index n of the uppermost layer 42 with respect to light having a wavelength of 193 nm is within a predetermined range, the uppermost layer 42 can have a more appropriate function as an antireflection film with respect to DUV light having a wavelength of 193 nm. As a result, the reflectance of the phase shift film 4 with respect to DUV light is sufficiently low. Therefore, the phase shift pattern 4a can be inspected with high accuracy using DUV light.

In the reflective mask blank 100 of the present embodiment, an extinction coefficient k of the uppermost layer 42 with respect to light having a wavelength of 193 nm is preferably 3.2 or less. Meanwhile, the extinction coefficient k of the uppermost layer 42 with respect to light having a wavelength of 193 nm is preferably 0.3 or more, and more preferably 0.5 or more.

Meanwhile, in the reflective mask blank 100 of the present embodiment, the refractive index n of the lower layer 41 with respect to light having a wavelength of 193 nm is preferably 2.5 or less, and more preferably less than 1.9. Meanwhile, the extinction coefficient k of the lower layer 41 with respect to light having a wavelength of 193 nm is preferably 3.5 or less. In addition, the extinction coefficient k of the lower layer 41 with respect to light having a wavelength of 193 nm is preferably larger than 0.5, and more preferably 1.0 or more.

In the reflective mask blank 100 of the present embodiment, since the extinction coefficient k of the uppermost layer 42 with respect to light having a wavelength of 193 nm is a predetermined value or less, high-accuracy inspection can be performed in mask inspection using DUV light.

By inclusion of the phase shift film 4 including the predetermined lower layer 41 and uppermost layer 42 in the reflective mask blank 100 of the present embodiment, even in a case where the film thickness of the phase shift film 4 having a multilayer structure changes, a change in the phase difference and/or the reflectance of the phase shift film 4 with respect to exposure light (EUV light having a wavelength of 13.5 nm) can be reduced. In addition, in the reflective mask blank 100 of the present embodiment, the uppermost layer 42 also functions as an antireflection film with respect to DUV light. Therefore, high-accuracy inspection can be performed in mask inspection using DUV light.

In the reflective mask blank 100 of the present embodiment, as described below, perpendicularity of a pattern sidewall shape can be increased when the phase shift film 4 is patterned by dry etching at the time of manufacturing the reflective mask 200.

The phase shift film 4 formed of the RuCr-based material can be patterned by dry etching by using a mixed gas of a chlorine-based gas and an oxygen gas (oxygen-containing chlorine-based gas) as an etching gas. In the present embodiment, the RuCrO-based material used for the uppermost layer 42 has a lower etching rate for dry etching using an oxygen-containing chlorine-based gas than a RuCr metal material and a RuCrN-based material. In general, in a case of dry etching using an oxygen-containing chlorine-based gas, etching tends to be isotropic as compared with dry etching using a fluorine-based gas. For this reason, in dry etching using an oxygen-containing chlorine-based gas, it is necessary to perform over-etching for a long time in order to enhance the perpendicularity of the pattern of the phase shift film 4. If the etching rate of the uppermost layer 42 of the phase shift film 4 in dry etching using the oxygen-containing chlorine-based gas is high, an edge between a surface and a sidewall surface of the phase shift film 4 is etched, and a pattern edge is rounded. When the pattern edge is rounded, a line edge roughness (LER) and/or CD in-plane uniformity of the phase shift pattern 4a is likely to decrease.

As in the present embodiment, by forming the uppermost layer 42 of the phase shift film 4 with a RuCrO-based material, the etching rate of the uppermost layer 42 with respect to dry etching using an oxygen-containing chlorine-based gas can be lowered. Therefore, even in a case where over-etching is performed on a layer (for example, the lower layer 41) on the multilayer reflective film 2 side with respect to the uppermost layer 42 of the RuCrO-based material, the edge of the uppermost layer 42 can be suppressed from being rounded.

Meanwhile, in order to quickly perform over-etching, the lower layer 41 of the phase shift film 4 preferably has a high etching rate with respect to dry etching using an oxygen-containing chlorine-based gas. Therefore, the content of oxygen in the lower layer 41 is preferably less than 10 atomic %, and more preferably 5 atomic % or less. Still more preferably, an analysis result of the content of oxygen by composition analysis (for example, X-ray optical spectroscopic analysis, Rutherford backscattering analysis, or the like) is a lower detection limit value or less.

Note that it is known that when dry etching with an oxygen-containing chlorine-based gas is performed on a thin film formed of a material containing chromium, an etching rate increases as the content of oxygen in the thin film increases. As described above, the thin film formed of a RuCr-based material has a tendency opposite thereto. Such etching characteristics of the thin film formed of a RuCr-based material have been obtained as new findings as a result of intensive studies by the present inventor.

Meanwhile, by forming the lower layer 41 of the phase shift film 4 with a RuCrN-based material containing nitrogen, the crystallinity of the lower layer 41 can be reduced (the lower layer 41 can be made more microcrystalline or can be made amorphous). By making the lower layer 41 microcrystalline or amorphous, it is possible to reduce a line edge roughness of a sidewall when a pattern is formed by dry etching. In addition, as the crystallinity of the lower layer 41 increases, the surface roughness of the lower layer 41 increases. Since the surface roughness of the lower layer 41 is reflected on the outermost layer, when the surface roughness of the lower layer 41 increases, the surface roughness of the phase shift film 4 increases. When the surface roughness of the phase shift film 4 is large, a so-called pseudo defect increases when defect inspection is performed with a defect inspection apparatus for a mask blank. The pseudo defect means that a portion having no defect is erroneously detected as a defect. By inclusion of nitrogen in the lower layer 41 of the phase shift film 4, generation of this pseudo defect can be suppressed.

The phase difference and the reflectance of the phase shift film 4 can be adjusted by changing the refractive index n, the extinction coefficient k, and the film thickness. The film thickness of the phase shift film 4 is preferably 60 nm or less, more preferably 50 nm or less, and still more preferably 45 nm or less. The film thickness of the phase shift film 4 is preferably 25 nm or more. Note that in a case where the protective film 3 is included, the phase difference and the reflectance of the phase shift film 4 can also be adjusted in consideration of the refractive index n, the extinction coefficient k, and the film thickness of the protective film 3.

The material (predetermined RuCrO-based material) of the uppermost layer 42 of the phase shift film 4 can contain an element other than ruthenium (Ru), chromium (Cr), and oxygen (O) within a range not largely affecting the refractive index and the extinction coefficient. The material of the uppermost layer 42 can contain, for example, an element such as nitrogen (N), carbon (C), or boron (B) in addition to Ru and Cr. In a case where the material of the uppermost layer 42 of the phase shift film 4 contains Ru, Cr, O, and another element, the content of the above other element is preferably 10 atomic % or less, and more preferably 5 atomic % or less.

The thin film (for example, the lower layer 41 and the uppermost layer 42) constituting the phase shift film 4 formed of the above predetermined material can be formed by a known method such as a magnetron sputtering method such as a DC sputtering method or an RF sputtering method, or a reactive sputtering method using an oxygen gas or the like. As a target, an alloy target of Ru and Cr can be used.

By using a Ru target and a Cr target as targets, a film can be formed as co-sputtering. The co-sputtering has an advantage that a composition ratio between metal elements can be easily adjusted. However, in the co-sputtering, the crystalline state of the film may easily turn into a columnar structure as compared with use of the alloy target. The crystalline state of the thin film can be made amorphous by forming the film so as to contain nitrogen (N) in the film during sputtering.

The phase shift film 4 can be a multilayer film further including a layer other than the lower layer 41 and the uppermost layer 42. For example, the phase shift film 4 can further include a layer for enhancing etching selectivity with the protective film 3 between the lower layer 41 and the protective film 3. In addition, the phase shift film 4 can further include a layer for enhancing optical characteristics between the uppermost layer 42 and the lower layer 41. Note that the number of layers of the phase shift film 4 is preferably not so large from a viewpoint of productivity. Therefore, the phase shift film 4 of the present embodiment preferably includes two layers of the lower layer 41 and the uppermost layer 42.

Even if the film thickness of the phase shift film 4 slightly changes with respect to a design value (for example, within a range of ±0.5% with respect to a design film thickness), as for a phase difference with respect to EUV light having a wavelength of 13.5 nm, variations in the phase difference between surfaces are desired to be within a range of a predetermined phase difference ±2 degrees (for example, in a case where the phase difference is 180 degrees, within a range of 180 degrees±2 degrees), and as for the reflectance, variations in the reflectance between surfaces are desired to be within a range of a predetermined reflectance±0.2% (for example, in a case where a relative reflectance is 6%, within a range of 6%±0.2%). In a case where the phase shift film 4 is formed into a multilayer film, it is easy to control the variations in the phase difference between surfaces and the variations in the reflectance between surfaces to be within predetermined ranges. As described above, by forming the phase shift film 4 into a multilayer film, various functions can be added to each layer.

<<Etching Mask Film 6>>

The etching mask film 6 can be formed on the phase shift film 4 or in contact with a surface of the phase shift film 4. As a material of the etching mask film 6, a material with which an etching selective ratio of the phase shift film 4 to the etching mask film 6 is high is used. Here, the expression "etching selective ratio of B to A" means a ratio of an etching rate of B that is a layer desired to be etched to an etching rate of A that is a layer not desired to be etched (layer serving as a mask). Specifically, "etching selective ratio of B to A" is specified by a formula of "etching selective ratio of B to A=etching rate of B/etching rate of A". In addition, the expression "high selective ratio" means that a value of the selective ratio defined above is large as compared with that of an object for comparison. The etching selective ratio of the phase shift film 4 to the etching mask film 6 is preferably 1.5 or more, and more preferably 3 or more.

The phase shift film 4 formed of a material containing Ru and Cr (RuCr-based material) can be etched by dry etching with a chlorine-based gas containing oxygen or an oxygen gas. As a material having a high etching selective ratio of the phase shift film 4 formed of a predetermined RuCr-based material to the etching mask film 6, a material of silicon (Si) or a silicon compound can be used.

Examples of the silicon compound that can be used for the etching mask film 6 include a material containing silicon (Si) and at least one element selected from nitrogen (N), oxygen (O), carbon (C), and hydrogen (H), metallic silicon containing a metal in silicon or a silicon compound (metal silicide), and a metal silicon compound (metal silicide compound). Examples of the metal silicon compound include a material containing a metal, Si, and at least one element selected from N, O, C, and H.

The film thickness of the etching mask film 6 is desirably 2 nm or more from a viewpoint of obtaining a function as an etching mask for accurately forming a transfer pattern on the phase shift film 4. In addition, the film thickness of the etching mask film 6 is desirably 15 nm or less from a viewpoint of reducing the film thickness of a resist film 8.

<<Conductive Film 5>>

The conductive film 5 for an electrostatic chuck is generally formed on the second main surface (back surface) side of the substrate 1 (side opposite to the multilayer reflective film 2 forming surface). An electrical characteristic (sheet resistance) required for the conductive film 5 for an electrostatic chuck is usually 100Ω/□ (Ω/square) or less. The conductive film 5 can be formed, for example, by a magnetron sputtering method or an ion beam sputtering method using a target of a metal such as chromium (Cr) or tantalum (Ta) or an alloy thereof.

A material containing chromium (Cr) for the conductive film 5 is preferably a Cr compound containing Cr and further containing at least one selected from boron (B), nitrogen (N), oxygen (O), and carbon (C).

As a material containing tantalum (Ta) for the conductive film 5, it is preferable to use Ta (tantalum), an alloy containing Ta, or a Ta compound containing either of Ta or an alloy containing Ta and at least one selected from boron, nitrogen, oxygen, and carbon.

The thickness of the conductive film 5 is not particularly limited as long as a function of the conductive film 5 for an electrostatic chuck is satisfied. The thickness of the conductive film 5 is usually 10 nm to 200 nm. In addition, the conductive film 5 further adjusts a stress on the second main surface side of the mask blank 100. That is, the conductive film 5 is adjusted such that the flat reflective mask blank 100 can be obtained in balance with a stress from various films formed on the first main surface side.

<Reflective Mask 200 and Method for Manufacturing the Same>

The present embodiment is the reflective mask 200 including the multilayer reflective film 2 and the phase shift film 4 having a transfer pattern formed thereon in this order on a main surface of the substrate 1. The phase shift film 4 (phase shift pattern 4a) having a transfer pattern formed thereon is the phase shift film 4 similar to the phase shift film 4 of the above reflective mask blank 100 of the present embodiment. By patterning the phase shift film 4 of the above reflective mask blank 100 of the present embodiment, the phase shift pattern 4a (transfer pattern) can be formed. Patterning of the phase shift film 4 can be performed with a predetermined dry etching gas. The phase shift pattern 4a of the reflective mask 200 can absorb EUV light and reflect a part of the EUV light at a predetermined phase difference with respect to an opening (a portion where the phase shift pattern 4a is not formed). As the predetermined dry etching gas, a mixed gas of a chlorine-based gas and an oxygen gas, an oxygen gas, or the like can be used. In order to pattern the phase shift film 4, the etching mask film 6 can be formed on the phase shift film 4 as necessary. In this case, the phase shift pattern 4a can be formed by dry-etching the phase shift film 4 using an etching mask pattern 6a as a mask.

A method for manufacturing the reflective mask 200 using the reflective mask blank 100 of the present embodiment will be described. Here, only an outline will be described, and a detailed description will be given below in Examples with reference to the drawings. In addition, an example of using the reflective mask blank 100 including the etching mask film 6 as illustrated in FIG. 2 will be described.

The reflective mask blank 100 is prepared, and the resist film 8 is formed on the etching mask film 6 on the first main surface of the reflective mask blank 100 (this step is not necessary in a case where the resist film 8 is included as the reflective mask blank 100). A desired pattern is drawn (exposed) on the resist film 8 and further developed and rinsed to form a predetermined resist pattern 8a.

Next, the etching mask film 6 is etched using the resist pattern 8a as a mask to form the etching mask pattern 6a. Next, the resist pattern 8a is removed, for example, by ashing or with a resist peeling liquid. The phase shift film 4 is etched using the etching mask pattern 6a as a mask to form the phase shift pattern 4a. Next, the etching mask pattern 6a is removed to form the phase shift pattern 4a. Finally, wet cleaning is performed using an acidic or alkaline aqueous solution.

Since the material of the phase shift film 4 contains ruthenium (Ru) and chromium (Cr), a chlorine-based gas containing oxygen or an oxygen gas is used as an etching gas of the phase shift film 4. When this etching gas is used, the protective film 3 is formed of silicon (Si) or a material containing silicon (Si) and oxygen (O), and therefore it is possible to prevent occurrence of roughness on a surface of the protective film 3 at the time of etching the phase shift film 4.

Through the above steps, the reflective mask 200 having the highly accurate and fine phase shift pattern 4a with a small shadowing effect and a small sidewall roughness can be obtained.

<Method for Manufacturing Semiconductor Device>

The present embodiment is a method for manufacturing a semiconductor device, the method including using the above-described reflective mask 200. The semiconductor device can be manufactured by setting the reflective mask 200 of the present embodiment in an exposure apparatus having an EUV light exposure light source and then transferring a transfer pattern onto a resist film formed on a transfer-receiving substrate.

Specifically, by performing EUV exposure using the above reflective mask 200 of the present embodiment, a desired transfer pattern based on the phase shift pattern 4a of the reflective mask 200 can be formed on the semiconductor substrate 1. In addition, since the reflective mask 200 includes a phase shift film having a small change in the phase difference and/or the reflectance of the phase shift film with respect to exposure light (EUV light having a wavelength of 13.5 nm) even in a case where the film thickness of the phase shift film changes, a desired pattern can be formed on the semiconductor substrate 1 with high dimensional accuracy. In addition, it is also advantageous that the phase shift pattern 4a is a fine and highly accurate pattern with a small sidewall roughness in order to form a desired pattern on the semiconductor substrate 1 with high dimensional accuracy. Through various steps such as etching of a film to be processed, formation of an insulating film and a conductive film, introduction of a dopant, and annealing in addition to this lithography step, it is possible to manufacture a semiconductor device in which a desired electronic circuit is formed.

Since the phase shift film 4 of the reflective mask blank 100 of the present embodiment includes two layers of the predetermined lower layer 41 and uppermost layer 42, even in a case where the film thickness of the phase shift film 4 of the reflective mask blank 100 changes, a change in the phase difference and/or the reflectance of the phase shift film 4 with respect to exposure light is small. In addition, in the reflective mask blank 100 of the present embodiment, an etching rate of the uppermost layer 42 is lower than that of the lower layer 41 when the phase shift pattern 4a is formed. As a result, in the reflective mask 200 of the present embodiment, the phase shift pattern 4a has a small sidewall roughness and a stable cross-sectional shape. Therefore, by using the reflective mask blank 100 of the present embodiment, a semiconductor device having a fine and highly accurate transfer pattern can be manufactured.

EXAMPLES

Hereinafter, Examples will be described with reference to the drawings. The present embodiment is not limited to these Examples. Note that in Examples, the same reference sign will be used for similar constituent elements, and description thereof will be simplified or omitted.

Table 1 presents the materials and the film thicknesses of an etching mask film 6, an uppermost layer 42 and a lower layer 41 of a phase shift film 4, and a protective film 3 of each of Example and Comparative Examples.

Example 1

As Example 1, a reflective mask blank 100 having the structure illustrated in FIG. 2 was manufactured. The reflective mask blank 100 includes a conductive film 5, a substrate 1, a multilayer reflective film 2, a protective film 3, a phase shift film 4, and an etching mask film 6. The phase shift film 4 of Example 1 includes an uppermost layer 42 and a lower layer 41. Table 1 presents the materials and the film thicknesses of the uppermost layer 42 and the lower layer 41 of Example 1.

First, a method for manufacturing the reflective mask blank 100 of Example 1 will be described.

A $SiO_2$—$TiO_2$-based glass substrate that is a low thermal expansion glass substrate having 6025 size (approximately 152 mm×152 mm×6.35 mm) and having polished both main surfaces that are a first main surface and a second main surface was prepared as the substrate 1. The main surfaces were subjected to polishing including a rough polishing step, a precision polishing step, a local processing step, and a touch polishing step such that the main surfaces were flat and smooth.

Next, the conductive film 5 formed of a CrN film was formed on the second main surface (back surface) of the $SiO_2$—$TiO_2$-based glass substrate 1 by a magnetron sputtering (reactive sputtering) method under the following conditions.

Conditions for forming the conductive film 5: a Cr target, a mixed gas atmosphere of an argon (Ar) gas and a nitrogen ($N_2$) gas, and a film thickness of 20 nm.

Next, the multilayer reflective film 2 was formed on the main surface (first main surface) of the substrate 1 on a side opposite to a side on which the conductive film 5 was formed. The multilayer reflective film 2 formed on the substrate 1 was a periodic multilayer reflective film containing molybdenum (Mo) and silicon (Si) in order to make the multilayer reflective film 2 suitable for EUV light having a wavelength of 13.5 nm. The multilayer reflective film 2 was formed using a Mo target and a Si target by alternately building up a Mo layer and a Si layer on the substrate 1 by an ion beam sputtering method in a krypton (Kr) gas atmosphere. First, a Si film was formed so as to have a film thickness of 4.2 nm, and then a Mo film was formed so as to have a film thickness of 2.8 nm. This stack is counted as one period, the stack of a Si film and a Mo film was built up for 40 periods in a similar manner, and finally, a Si film was formed so as to have a film thickness of 4.0 nm to form the multilayer reflective film 2.

Subsequently, the protective film 3 formed of a $SiO_2$ film was formed so as to have a film thickness of 2.6 nm on a surface of the multilayer reflective film 2 in an Ar gas atmosphere by an RF sputtering method using a $SiO_2$ target.

Next, a thin film (RuCrN film) formed of ruthenium (Ru), chromium (Cr), and nitrogen (N) was formed as the lower layer 41 of the phase shift film 4 by a DC magnetron sputtering method. Table 1 presents the composition and film thickness of the lower layer 41 of Example 1. The lower layer 41 was formed so as to have a film thickness of 26.5 nm in a mixed gas atmosphere of a krypton (Kr) gas and a nitrogen (N₂) gas using a Ru target and a Cr target. When a RuCrN film formed on another substrate in a similar procedure was analyzed by X-ray photoelectron spectroscopy, the composition (atomic ratio) of the RuCrN film was Ru:Cr:N=79.4:13.6:7.0. The Cr/[Ru+Cr] ratio of the RuCrN film was 0.146. Furthermore, when the crystal structure of the RuCrN film was measured by the X-ray diffractometer (XRD), the RuCrN film had an amorphous structure.

The refractive index n and the extinction coefficient (refractive index imaginary part) k of the lower layer 41 (RuCrN film) of Example 1 formed as described above at a wavelength of 13.5 nm were as follows, respectively.

RuCrN film: n=0.900, k=0.023

The refractive index n and the extinction coefficient (refractive index imaginary part) k of the lower layer 41 (RuCrN film) of Example 1 at a wavelength of 193 nm were as follows, respectively.

RuCrN film: n=1.71, k=2.35

Next, a thin film (RuCrO film) formed of ruthenium (Ru), chromium (Cr), and oxygen (O) was formed as the uppermost layer 42 of the phase shift film 4 by a DC magnetron sputtering method (reactive sputtering method). Table 1 presents the composition and film thickness of the uppermost layer 42 of Example 1. The uppermost layer 42 was formed so as to have a film thickness of 8.5 nm in a mixed gas atmosphere of a krypton (Kr) gas and an oxygen (02) gas using a Ru target and a Cr target by reactive sputtering. When a RuCrO film formed on another substrate in a similar procedure was analyzed by X-ray photoelectron spectroscopy, the composition (atomic ratio) of the RuCrO film was Ru:Cr: 0=18.1:29.5:52.4. The Cr/[Ru+Cr] ratio of the RuCrO film was 0.619. Furthermore, when the crystal structure of the RuCrO film was measured by the X-ray diffractometer (XRD), the RuCrO film had an amorphous structure.

The refractive index n and the extinction coefficient (refractive index imaginary part) k of the uppermost layer 42 (RuCrO film) of Example 1 formed as described above at a wavelength of 13.5 nm were as follows, respectively.

RuCrO film: n=0.931, k=0.027

The refractive index n and the extinction coefficient (refractive index imaginary part) k of the uppermost layer 42 (RuCrO film) of Example 1 at a wavelength of 193 nm were as follows, respectively.

RuCrO film: n=1.97, k=1.39

Next, the etching mask film 6 formed of a Si₃N₄ film was formed on the phase shift film 4. The Si₃N₄ film was formed so as to have a film thickness of 20 nm using a Si target in a nitrogen gas atmosphere by a reactive sputtering method.

Next, using the above reflective mask blank 100, a reflective mask 200 of Example 1 was manufactured.

Figure 3A:
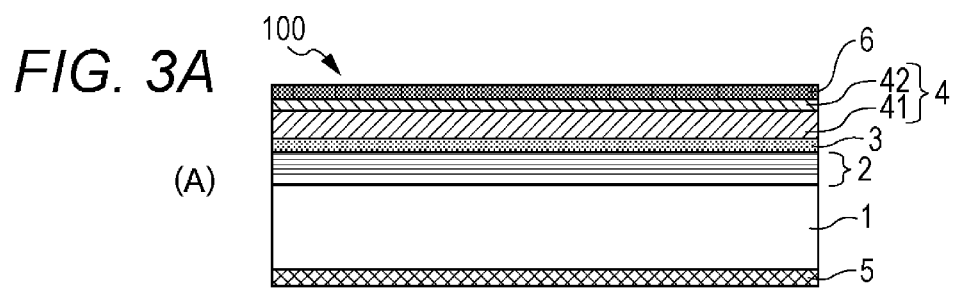
FIGS. 3A to 3F are process diagrams illustrating a process of preparing a reflective mask from a reflective mask blank in main part schematic cross-sectional diagrams.

FIGS. 3A to 3F are main part schematic cross-sectional diagrams illustrating a process of preparing the reflective mask 200 from the reflective mask blank 100. First, the above-described reflective mask blank 100 of Example 1 was prepared (FIG. 3A).

Figure 3B:
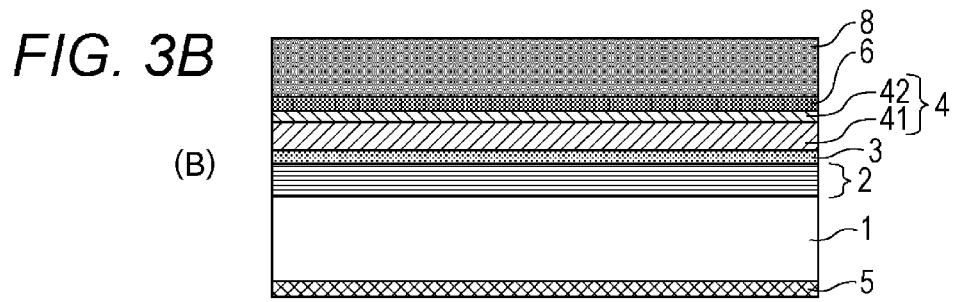
Figure 3C:
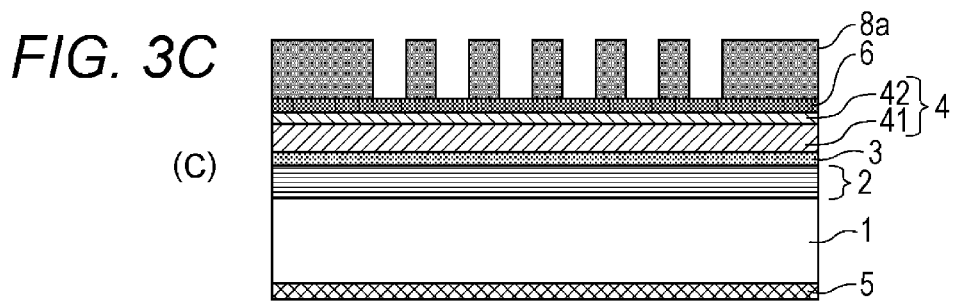
Figure 3D:
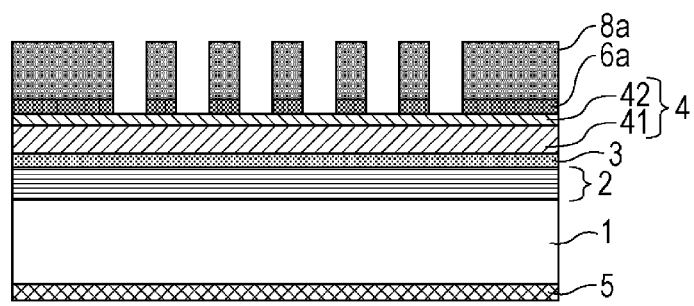
Figure 3E:
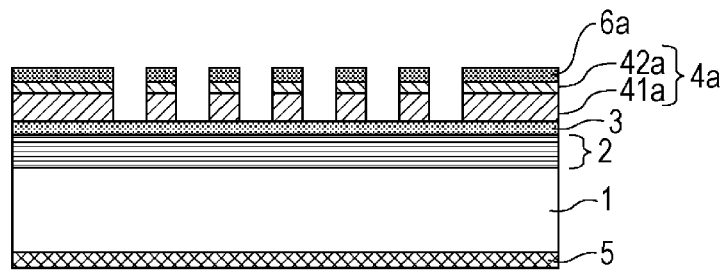

Next, a resist film 8 was formed with a thickness of 100 nm on the etching mask film 6 of the reflective mask blank 100 (FIG. 3B). Then, a desired pattern was drawn (exposed) on this resist film 8 and further developed and rinsed to form a predetermined resist pattern 8a (FIG. 3C). Next, the etching mask film 6 (Si₃N₄ film) was dry-etched using a CF₄ gas by using the resist pattern 8a as a mask to form an etching mask pattern 6a (FIG. 3D). Thereafter, the resist pattern 8a was peeled off by oxygen ashing. Next, the RuCrO film (uppermost layer 42) of the phase shift film 4 was dry-etched using a mixed gas of a Cl₂ gas and an O₂ gas by using the etching mask pattern 6a as a mask. Subsequently, the RuCrN film (lower layer 41) was dry-etched using the same mixed gas of a Cl₂ gas and an O₂ gas to form a phase shift pattern 4a (lower layer pattern 41a and uppermost layer pattern 42a) (FIG. 3E).

Figure 3F:
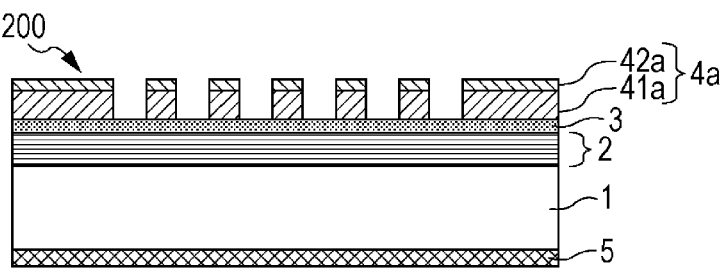

Thereafter, the etching mask pattern 6a was removed. Finally, wet cleaning was performed with deionized water (DIW) to manufacture the reflective mask 200 of Example 1 (FIG. 3F). Note that mask defect inspection can be performed as necessary after the wet cleaning, and a mask defect can be corrected appropriately.

The relative reflectance of the phase shift film 4 (phase shift pattern 4a) of Example 1 including the uppermost layer 42 and the lower layer 41 at a wavelength of 13.5 nm was 17.6% (absolute reflectance was 11.6%). In addition, the film thickness of the phase shift film 4 is 35.0 nm. At this film thickness, a phase difference when the phase shift film 4 is patterned corresponds to 180 degrees.

The reflectance (%) (absolute reflectance) of the phase shift film 4 (phase shift pattern 4a) of Example 1 including the uppermost layer 42 and the lower layer 41 with respect to DUV light (wavelength: 193 nm) was measured. The absolute reflectance (%) of the phase shift film 4 of Example 1 with respect to DUV light (wavelength: 193 nm) was 31.3%. This absolute reflectance (%) is lower than that in Comparative Example described later. In addition, the absolute reflectance (%) with respect to DUV light (wavelength 193 nm) in an area where the protective film 3 of the reflective mask 200 of Example 1 was exposed (area having no phase shift pattern 4a) was 57.3%. In the reflective mask 200 of Example 1, a difference in absolute reflectance with respect to DUV light between the area having the phase shift pattern 4a and the area having no phase shift pattern 4a is sufficiently ensured, and it can be said that high-accuracy inspection can be performed in mask inspection using DUV light having a wavelength of 193 nm as inspection light.

In the reflective mask 200 of Example 1, since the phase shift film 4 includes two layers of the predetermined lower layer 41 and uppermost layer 42, even in a case where the film thickness of the phase shift film 4 changed, a change in the phase difference and/or the reflectance of the phase shift film 4 was small. That is, FIG. 4 illustrates a relationship between the film thickness of the phase shift film 4 corresponding to Example 1, and a relative reflectance and a phase difference with respect to EUV light having a wavelength of 13.5 nm. Since the film thickness of the phase shift film 4 of Example 1 is 35 nm, as illustrated in FIG. 4, it is obvious that even in a case where the film thickness of the phase shift film 4 of Example 1 slightly changes, a change in the phase difference and/or the reflectance of the phase shift film 4 is small. Note that in a case of Comparative Example 2 (phase shift film 4 of a single layer of a RuCr film) described later, when the film thickness changes, a change in the phase difference and/or the reflectance of the phase shift film 4 is relatively large. This is obvious from a comparison with the relationship between the film thickness of the phase shift film 4 of a single layer of a RuCr film corresponding to Comparative Example 2, and a relative reflectance and a phase difference with respect to EUV light having a wavelength of 13.5 nm, illustrated in FIG. 4.

In addition, the film thickness of the phase shift pattern 4a of Example 1 was 35 nm, which was thinner than that of a conventional absorber film formed of a Ta-based material.

In addition, in the reflective mask blank 100 used for manufacturing the reflective mask 200 of Example 1, the phase shift film 4 includes two layers of the predetermined lower layer 41 and uppermost layer 42. Therefore, an etching rate of the uppermost layer 42 is lower than that of the lower layer 41 when the phase shift pattern 4a is formed. Therefore, the phase shift pattern 4a had a small sidewall roughness and a stable cross-sectional shape. Therefore, the resist pattern 8a transferred and formed using the reflective mask 200 having the phase shift pattern 4a had small in-plane variations in LER and dimension and high transfer accuracy. In addition, since the relative reflectance of a phase shift surface (a reflectance with respect to the reflectance of a surface of the multilayer reflective film 2 with the protective film 3) was 17.6% (the absolute reflectance was 11.6%), a sufficient phase shift effect was obtained, and EUV exposure with a high exposure margin and a high focus margin could be performed.

The reflective mask 200 manufactured in Example 1 was set in an EUV scanner, and EUV exposure was performed on a wafer on which a film to be processed and a resist film were formed on a semiconductor substrate. Then, this resist film that had been subjected to exposure was developed to form a resist pattern on the semiconductor substrate on which the film to be processed was formed. This resist pattern was transferred onto the film to be processed by etching, and through various steps such as formation of an insulating film and a conductive film, introduction of a dopant, and annealing, a semiconductor device having desired characteristics could be manufactured.

Comparative Example 1

In Comparative Example 1, a reflective mask blank 100 and a reflective mask 200 were each manufactured so as to have a structure similar to that in Example 1 by a method similar to that in Example 1, and a semiconductor device was manufactured by a method similar to that in Example 1, except that a $SiO_2$ film was used as the uppermost layer 42 of the phase shift film 4. Table 1 presents the materials and the film thicknesses of an etching mask film 6, an uppermost layer 42 and a lower layer 41 of a phase shift film 4, and a protective film 3 of Comparative Example 1.

A RuCrN film of the lower layer 41 of Comparative Example 1 was formed so as to have a film thickness of 33 nm under the same film forming conditions as those in Example 1.

In addition, a $SiO_2$ film of the uppermost layer 42 of Comparative Example 1 was formed so as to have a film thickness of 3.0 nm on a surface of the lower layer 41 in an Ar gas atmosphere by an RF sputtering method using a $SiO_2$ target.

The refractive index n and the extinction coefficient (refractive index imaginary part) k of the uppermost layer 42 ($SiO_2$ film) of Comparative Example 1 at a wavelength of 13.5 nm were as follows, respectively.

$SiO_2$ film: n=0.974, k=0.012

In addition, the refractive index n and the extinction coefficient (refractive index imaginary part) k of the uppermost layer 42 ($SiO_2$ film) of Comparative Example 1 at a wavelength of 193 nm were as follows, respectively.

$SiO_2$ film: n=1.56, k=0.00

In addition, when the reflective mask 200 of Comparative Example 1 was manufactured, an uppermost layer pattern 42a of the $SiO_2$ film was formed by dry etching using a $CHF_3$+He gas.

The relative reflectance of the phase shift film 4 (phase shift pattern 4a) of Comparative Example 1 including the uppermost layer 42 and the lower layer 41 at a wavelength of 13.5 nm was 16.8% (absolute reflectance was 11.1%). In addition, the film thickness of the phase shift film 4 is 36 nm. At this film thickness, a phase difference when the phase shift film 4 is patterned corresponds to 180 degrees.

The reflectance (%) (absolute reflectance) of the phase shift film 4 (phase shift pattern 4a) of Comparative Example 1 including the uppermost layer 42 and the lower layer 41 with respect to DUV light (wavelength: 193 nm) was measured. The absolute reflectance (%) of the phase shift film 4 (phase shift pattern 4a) of Comparative Example 1 with respect to DUV light (wavelength: 193 nm) was 44.4%. The absolute reflectance of the phase shift film 4 of Comparative Example 1 with respect to DUV light is very high. In addition, the absolute reflectance (%) with respect to DUV light (wavelength 193 nm) in an area where the protective film 3 of the reflective mask 200 of Comparative Example 1 was exposed (area having no phase shift pattern 4a) was 57.3%. In the reflective mask 200 of Comparative Example 1, a difference in absolute reflectance with respect to DUV light between the area having the phase shift pattern 4a and the area having no phase shift pattern 4a is small, and it is difficult to perform high-accuracy inspection when mask inspection is performed with a mask inspection apparatus using DUV light having a wavelength of 193 nm as inspection light.

In the reflective mask 200 of Comparative Example 1, since the uppermost layer 42 of the phase shift film 4 is a $SiO_2$ film, as compared with Example 1, in a case where the film thickness of the phase shift film 4 changed, a change in the phase difference and/or the reflectance of the phase shift film 4 was large.

In addition, in the reflective mask blank 100 used for manufacturing the reflective mask 200 of Comparative Example 1, the uppermost layer 42 of the phase shift film 4 is a $SiO_2$ film. Therefore, as compared with Example 1, in Comparative Example 1, a step was generated between the uppermost layer 42 and the lower layer 41 on a sidewall of the phase shift pattern 4a of the manufactured reflective mask 200. Therefore, a resist pattern 8a transferred and formed using the reflective mask 200 having the phase shift pattern 4a had large in-plane variations in LER and dimension, and did not have very high transfer accuracy.

Unlike the case of Example 1, when the reflective mask 200 prepared in Comparative Example 1 was used, a semiconductor device having desired characteristics could not be manufactured.

Comparative Example 2

In Comparative Example 2, a reflective mask blank 100 and a reflective mask 200 were each manufactured so as to have a structure similar to that in Example 1 by a method similar to that in Example 1, and a semiconductor device was manufactured by a method similar to that in Example 1, except that a single-layer RuCrN film was used as the phase shift film 4. Table 1 presents the materials and the film thicknesses of an etching mask film 6, a phase shift film 4, and a protective film 3 of Comparative Example 2.

The RuCrN film of the phase shift film 4 of Comparative Example 2 was formed so as to have a film thickness of 31.5 nm under the same film forming conditions as those of the RuCrN film of Example 1.

The relative reflectance of the phase shift film 4 (phase shift pattern 4a) of Comparative Example 2 having the single-layer phase shift film 4 at a wavelength of 13.5 nm was 30.5% (absolute reflectance was 20.1%). In addition, the film thickness of the phase shift film 4 is 31.5 nm. At this film thickness, a phase difference when the phase shift film 4 is patterned corresponds to 180 degrees.

The absolute reflectance (%) of the phase shift film 4 (phase shift pattern 4a) of Comparative Example 2 having the single-layer phase shift film 4 with respect to DUV light (wavelength: 193 nm) was measured. The absolute reflectance (%) of the phase shift film 4 (phase shift pattern 4a) of Comparative Example 2 with respect to DUV light (wavelength: 193 nm) was 47.6%. The absolute reflectance of the phase shift film 4 of Comparative Example 2 with respect to DUV light is very high. In addition, the absolute reflectance (%) with respect to DUV light (wavelength 193 nm) in an area where the protective film 3 of the reflective mask 200 of Comparative Example 2 was exposed (area having no phase shift pattern 4a) was 57.3%. In the reflective mask 200 of Comparative Example 2, a difference in absolute reflectance with respect to DUV light between the area having the phase shift pattern 4a and the area having no phase shift pattern 4a is small, and it is difficult to perform high-accuracy inspection when mask inspection is performed with a mask inspection apparatus using DUV light having a wavelength of 193 nm as inspection light.

In the reflective mask 200 of Comparative Example 2, since the phase shift film 4 is a single layer, as compared with Example 1, in a case where the film thickness of the phase shift film 4 changed, a change in the phase difference and/or the reflectance of the phase shift film 4 was large.

That is, FIG. 4 illustrates a relationship between the film thickness of the phase shift film 4 corresponding to Comparative Example 2, and a relative reflectance and a phase difference with respect to EUV light having a wavelength of 13.5 nm. Since the film thickness of the phase shift film 4 of Comparative Example 2 is 31.5 nm, as illustrated in FIG. 4, it is obvious that in a case where the film thickness of the phase shift film 4 of Comparative Example 2 slightly changes, a change in the phase difference and/or the reflectance of the phase shift film 4 is large as compared with the phase shift film 4 corresponding to Example 1.

In addition, in the reflective mask blank 100 used for manufacturing the reflective mask 200 of Comparative Example 2, the phase shift film 4 is a single layer. Therefore, as compared with Example 1, in Comparative Example 2, the phase shift pattern 4a of the manufactured reflective mask 200 had a large sidewall roughness and an unstable cross-sectional shape. Therefore, a resist pattern 8a transferred and formed using the reflective mask 200 having the phase shift pattern 4a had large in-plane variations in LER and dimension, and did not have very high transfer accuracy. In addition, since the phase shift film 4 of Comparative Example 2 has a large amount of change in reflectance with respect to a change in film thickness, the reflectance is likely to change even with respect to a minute change in film thickness of the phase shift film 4 while the phase shift film 4 is processed into the reflective mask 200. Therefore, an in-plane distribution of the reflectance of the phase shift pattern 4a of the finished reflective mask 200 with respect to EUV light has low uniformity. Therefore, it can be said that it is difficult to increase in-plane uniformity of a transfer image at the time of exposure transfer with the reflective mask 200 of Comparative Example 2.

Meanwhile, since the phase shift film 4 of the reflective mask blank 100 of Comparative Example 2 is a single layer, a surface layer of the phase shift film 4 is easily oxidized while the reflective mask 200 is manufactured from the reflective mask blank 100. In the case of the single-layer phase shift film 4, a change in optical characteristics of the entire phase shift film 4 caused by oxidation of the surface layer is relatively large. Therefore, stability of a transfer image at the time of exposure transfer with the reflective mask 200 of Comparative Example 2 is also low.

For these reasons, unlike the case of Example 1, in a case where the reflective mask 200 prepared in Comparative Example 2 was used, a semiconductor device having desired characteristics could not be manufactured.

TABLE 1

|  |  | Example 1 | Comparative Example 1 | Comparative Example 2 |
|---|---|---|---|---|
| Etching mask film | Material | $Si_3N_4$ | $Si_3N_4$ | $Si_3N_4$ |
|  | Film thickness (nm) | 20 nm | 20 nm | 20 nm |
| Uppermost layer | Material | RuCrO | $SiO_2$ | — |
|  | Film thickness (nm) | 8.5 | 3.0 | — |
| Lower layer | Material | RuCrN | RuCrN | RuCrN |
|  | Film thickness (nm) | 26.5 | 33 | 31.5 |
| Protective film | Material | $SiO_2$ | $SiO_2$ | $SiO_2$ |
|  | Film thickness (nm) | 2.6 | 2.6 | 2.6 |
| Relative reflectance (%) of phase shift film with respect to EUV light (wavelength: 13.5 nm) |  | 17.6 | 16.8 | 30.5 |
| Absolute reflectance (%) of phase shift film with respect to DUV light (wavelength: 193 nm) |  | 31.3 | 44.4 | 47.6 |

REFERENCE SIGNS LIST

1 Substrate
2 Multilayer reflective film
3 Protective film
4 Phase shift film
4a Phase shift pattern
5 Conductive film
6 Etching mask film
6a Etching mask pattern
8 Resist film
8a Resist pattern
41 Lower layer
41a Lower layer pattern
42 Uppermost layer
42a Uppermost layer pattern
100 Reflective mask blank
200 Reflective mask

The invention claimed is:

1. A reflective mask blank comprising a multilayer reflective film and a phase shift film in this order on a main surface of a substrate, wherein;

the phase shift film comprises a lower layer and an uppermost layer, the lower layer is located between the uppermost layer and the multilayer reflective film, the lower layer comprises ruthenium and chromium, or ruthenium, chromium, and nitrogen, the uppermost layer comprises ruthenium, chromium, and oxygen, the lower layer is formed of a material in which a total content of ruthenium and chromium is 90 atomic % or more, or a material in which a total content of ruthenium, chromium, and nitrogen is 90 atomic % or more, the uppermost layer is formed of a material in which a total content of ruthenium, chromium, and oxygen is 90 atomic % or more, and wherein an element having a largest content in the lower layer is ruthenium.

2. The reflective mask blank according to claim 1, wherein an element having a largest content in the uppermost layer is oxygen.

3. The reflective mask blank according to claim 1, wherein a refractive index of the uppermost layer with respect to light having a wavelength of 13.5 nm is larger than a refractive index of the lower layer with respect to light having a wavelength of 13.5 nm.

4. The reflective mask blank according to claim 3, wherein the refractive index of the uppermost layer with respect to light having a wavelength of 13.5 nm is 0.94 or less.

5. The reflective mask blank according to claim 1, wherein a refractive index of the uppermost layer with respect to light having a wavelength of 193 nm is larger than a refractive index of the lower layer with respect to light having a wavelength of 193 nm.

6. The reflective mask blank according to claim 5, wherein the refractive index of the uppermost layer with respect to light having a wavelength of 193 nm is 5.0 or less.

7. The reflective mask blank according to claim 5, wherein an extinction coefficient of the uppermost layer with respect to light having a wavelength of 193 nm is 3.2 or less.

8. The reflective mask blank according to claim 1, comprising a protective film between the multilayer reflective film and the phase shift film.

9. A reflective mask comprising a multilayer reflective film and a phase shift film having a transfer pattern formed thereon in this order on a main surface of a substrate, wherein:

the phase shift film comprises a lower layer and an uppermost layer, the lower layer is located between the uppermost layer and the multilayer reflective film, the lower layer comprises ruthenium and chromium, or ruthenium, chromium, and nitrogen, the uppermost layer comprises ruthenium, chromium, and oxygen, the lower layer is formed of a material in which a total content of ruthenium and chromium is 90 atomic % or more, or a material in which a total content of ruthenium, chromium, and nitrogen is 90 atomic % or more, the uppermost layer is formed of a material in which a total content of ruthenium, chromium, and oxygen is 90 atomic % or more, and wherein an element having a largest content in the lower layer is ruthenium.

10. The reflective mask according to claim 9, wherein an element having a largest content in the uppermost layer is oxygen.

11. The reflective mask according to claim 9, wherein a refractive index of the uppermost layer with respect to light having a wavelength of 13.5 nm is larger than a refractive index of the lower layer with respect to light having a wavelength of 13.5 nm.

12. The reflective mask according to claim 11, wherein the refractive index of the uppermost layer with respect to light having a wavelength of 13.5 nm is 0.94 or less.

13. The reflective mask according to claim 9, wherein a refractive index of the uppermost layer with respect to light having a wavelength of 193 nm is larger than a refractive index of the lower layer with respect to light having a wavelength of 193 nm.

14. The reflective mask according to claim 13, wherein the refractive index of the uppermost layer with respect to light having a wavelength of 193 nm is 5.0 or less.

15. The reflective mask according to claim 13, wherein an extinction coefficient of the uppermost layer with respect to light having a wavelength of 193 nm is 3.2 or less.

16. The reflective mask according to claim 9, comprising a protective film between the multilayer reflective film and the phase shift film.

17. A reflective mask blank comprising a multilayer reflective film and a phase shift film in this order on a main surface of a substrate, wherein:

the phase shift film comprises a lower layer and an uppermost layer, the lower layer is located between the uppermost layer and the multilayer reflective film, the lower layer comprises ruthenium and chromium or ruthenium, chromium, and nitrogen, the uppermost layer comprises ruthenium, chromium, and oxygen, the lower layer is formed of a material in which a total content of ruthenium and chromium is 90 atomic % or more, or a material in which a total content of ruthenium, chromium, and nitrogen is 90 atomic % or more, the uppermost layer is formed of a material in which a total content of ruthenium, chromium, and oxygen is 90 atomic % or more, and a ratio obtained by dividing a content in atomic % of chromium by a total content in atomic % of ruthenium and chromium in the uppermost layer is larger than a ratio obtained by dividing a content in atomic % of chromium by a total content in atomic % of ruthenium and chromium in the lower layer.

18. The reflective mask blank according to claim 17, wherein a refractive index of the uppermost layer with respect to light having a wavelength of 13.5 nm is larger than a refractive index of the lower layer with respect to light having a wavelength of 13.5 nm.

19. A reflective mask comprising a multilayer reflective film and a phase shift film having a transfer pattern formed thereon in this order on a main surface of a substrate, wherein:

the phase shift film comprises a lower layer and an uppermost layer, the lower layer is located between the uppermost layer and the multilayer reflective film, the lower layer comprises ruthenium and chromium or ruthenium, chromium, and nitrogen, the uppermost layer comprises ruthenium, chromium, and oxygen, the lower layer is formed of a material in which a total content of ruthenium and chromium is 90 atomic % or more, or a material in which a total content of ruthenium, chromium, and nitrogen is 90 atomic % or more, the uppermost layer is formed of a material in which a total content of ruthenium, chromium, and oxygen is 90 atomic % or more, and a ratio obtained by dividing a content in atomic % of chromium by a total content in atomic % of ruthenium and chromium in the uppermost layer is larger than a ratio obtained by dividing a content in atomic % of chromium by a total content in atomic % of ruthenium and chromium in the lower layer.

20. The reflective mask according to claim 19, wherein a refractive index of the uppermost layer with respect to light having a wavelength of 13.5 nm is larger than a refractive index of the lower layer with respect to light having a wavelength of 13.5 nm.

* * * * *